United States Patent
Kusumoto

(10) Patent No.: US 7,332,907 B2
(45) Date of Patent: Feb. 19, 2008

(54) SEMICONDUCTOR DEVICE HAVING A CONNECTION INSPECTING CIRCUIT FOR INSPECTING CONNECTIONS OF POWER SOURCE TERMINALS AND GROUNDING TERMINALS

(75) Inventor: Keiichi Kusumoto, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/726,514

(22) Filed: Mar. 22, 2007

(65) Prior Publication Data

US 2007/0164765 A1    Jul. 19, 2007

Related U.S. Application Data

(60) Division of application No. 11/224,193, filed on Sep. 12, 2005, now Pat. No. 7,211,996, which is a continuation of application No. 09/773,502, filed on Feb. 2, 2001, now Pat. No. 6,987,383.

(30) Foreign Application Priority Data

Feb. 10, 2000    (JP) .............................. 2000-33537

(51) Int. Cl.
G01R 31/02    (2006.01)
(52) U.S. Cl. ................... 324/158.1; 324/763; 324/765
(58) Field of Classification Search ..................... None
See application file for complete search history.

(56) References Cited

U.S. PATENT DOCUMENTS

| | | | |
|---|---|---|---|
| 4,241,373 A | 12/1980 | Mara et al. | |
| 5,793,126 A | 8/1998 | Gray | |
| 5,909,034 A | 6/1999 | Soldavini et al. | |
| 6,000,829 A | 12/1999 | Kurokawa et al. | |
| 6,008,664 A | 12/1999 | Jett et al. | |
| 6,046,600 A | 4/2000 | Whetsel | |
| 6,087,895 A | 7/2000 | Ono | |
| 6,281,696 B1 * | 8/2001 | Voogel | ........................ 324/765 |

(Continued)

FOREIGN PATENT DOCUMENTS

JP    60-185274    12/1985

(Continued)

*Primary Examiner*—Paresh Patel
(74) *Attorney, Agent, or Firm*—Hamre, Schumann, Mueller & Larson, P.C.

(57) ABSTRACT

The invention provides a semiconductor device that can inspect the connection states of power source terminals and grounding terminals of a test LSI at a low cost and in a short time, and an inspection method for the same. Switches SW1 to SW3 are provided between a plurality of power source terminals PD1 to PD3 and a power source line 10 inside the test LSI 4. A switch SWT is provided between the power source line and a grounding line 11 inside the test LSI. When inspecting the connection state of a certain power source terminal, the switch connected between the power source terminal and the power source line is closed, the switch SWT between the power source line and the grounding line is closed, and remaining switches are opened. A voltage is supplied between the power source terminal and a grounding terminal, and whether or not the power source terminal is in the connected state is determined by whether or not a current flows.

2 Claims, 16 Drawing Sheets

U.S. PATENT DOCUMENTS

| | | |
|---|---|---|
| 6,410,936 B1 | 6/2002 | Hongo |
| 6,714,002 B2 | 3/2004 | Stadler |
| 2001/0009029 A1 | 7/2001 | Farnworth et al. |
| 2002/0017707 A1 | 2/2002 | Suenaga et al. |
| 2002/0144199 A1 | 10/2002 | Takahashi |
| 2002/0149116 A1 | 10/2002 | Kusumoto |

FOREIGN PATENT DOCUMENTS

| | | |
|---|---|---|
| JP | 3-160377 A | 7/1991 |
| JP | 9-275191 | 10/1997 |
| JP | 10-213633 A | 8/1998 |

* cited by examiner

US 7,332,907 B2

1

SEMICONDUCTOR DEVICE HAVING A CONNECTION INSPECTING CIRCUIT FOR INSPECTING CONNECTIONS OF POWER SOURCE TERMINALS AND GROUNDING TERMINALS

This application is a divisional of U.S. Ser. No. 11/224,193, filed Sep. 12, 2005 now U.S. Pat. No. 7,211,996, which is a continuation of U.S. Ser. No. 09/773,502, filed Feb. 2, 2001 now U.S. Pat No. 6,987,383, which application is incorporated herein by reference.

BACKGROUND OF THE INVENTION

1. Field of the Invention

The present invention relates to inspection of connections between terminals in a semiconductor device having a semiconductor integrated circuit, particularly to inspection of connections of a plurality of power source terminals and grounding terminals.

2. Description of Prior Art

First, a package mounted with a chip on which a semiconductor integrated circuit (LSI) is formed is described. For example, in the case of a plastic package, connection between signal lines of the chip and leads is achieved by connecting a pad coupled to the signal line to a lead with a wire. By the way, a problem may occur in the course of sealing the chip in the package. The problem is separation of a wire from a pad, resulting from inappropriate connection of the wire to the pad. Then, after the chip is sealed in the package, an LSI including a separated wire malfunctions. Thus, such an LSI needs to be considered as a defective product. Therefore, after mounting and sealing the chip in the package, it is necessary to inspect whether or not pads and leads are connected accurately with wires by an inspection device.

The connection inspecting method for investigating whether or not wires connecting signal lines of an LSI are electrically connected between leads and pads is as follows: a predetermined voltage is supplied to the power source terminal and grounding terminal of an LSI to be inspected (hereinafter referred to as a test LSI), and a test voltage is supplied to the lead corresponding to the connection to be inspected.

FIG. 16 is a configuration of a test LSI and an inspection device thereof relating to a conventional method for inspecting connections of signal lines.

With reference to FIG. 16, a test LSI 4' includes wires W1, W2 and W3, and the wire W1 is connected to a cathode of a surge protection diode DU, the wire W3 is connected to an anode of a surge protection diode DL, and the wire W2 is connected to the connection between an anode of the surge protection diode DU and a cathode of the surge protection diode DL, each through an internal line of the test LSI.

To inspect whether the wire W2 is connected or unconnected, voltages of 3.3 V and 0 V are supplied respectively to leads L1 and L3 of the test LSI 4' connected to the wires W1 and W3, and then a voltage of −0.8 V that causes a forward current of the surge protection diode DL to flow is supplied to a lead L2 connected to the wire W2.

If the wire W2 is connected, a forward current Ia flows in the surge protection diode DL, and the forward current Ia is detected by a voltage generator 12. The voltage generator 12 includes a voltage source and an ammeter for measuring a current outputted from the voltage source.

On the other hand, if the wire W2 is unconnected, a forward voltage is not supplied to the surge protection diode

2

DL, so that no current flows. When a forward current of the surge protection diode DL flows, it can be determined that the wire W2 is connected. When a forward current does not flow, it can be determined that the wire W2 is unconnected. However, the connection inspection is limited to the case when the wire W2 is connected to a signal line. For example, a signal line connected to an input terminal of a digital circuit 6' or the like is inspected.

Conventionally, there has been no appropriate method for inspecting the connection states of power source lines and grounding lines. This reason is described below with reference to FIG. 17.

FIG. 17 is a configuration of a test LSI and an inspection device thereof relating to a conventional method for inspecting connections of power source lines.

As power source terminals and grounding terminals of the LSI, a plurality of terminals are arranged to assure the operation frequency and operation precision required for the circuits inside the chip or the amount of power source noise. Described herein is a LSI including three power source terminals. A description of grounding terminals is omitted because it is the same as the power source terminals.

In FIG. 17, a voltage is supplied from the outside to the inside of the LSI by three leads L4, L5 and L6, wires W4, W5 and W6, and pads PD4, PD5 and PD6, which are located inside the chip of the test LSI 4. That is, power source lines A, B and C branched from an LSI power source line 10' are connected to a printed board power source line 8' with three leads L4, L5 and L6 through pads PD4, PD5 and PD6, and wires W4, W5 and W6, respectively. Furthermore, although omitted in the drawing for simplification, a grounding voltage GND is supplied from the outside of the test LSI 4' to anodes of surge protection diodes D1, D2 and D3, which are connected respectively to the power source lines A, B and C of the test LSI 4'.

Now, assume that there is a deficiency in the connection of the wire W5, and the LSI power source line 10' is disconnected from the printed board power source line 8'. In this case, if a conventional inspection method for signal lines is applied to the inspection of the power source lines, the following problem occurs.

First, a voltage is supplied to the printed board power source line 8' by the voltage generator 12. The voltage supplied by the voltage generator 12 to the printed board power source line 8' is −0.8 V. The voltage of −0.8 V is the voltage when a forward current of the surge protection diodes flows. The surge protection diodes D1, D2 and D3 are connected respectively to the power source lines A, B and C, and a voltage that causes a forward current to flow is supplied. Therefore, although the wire W5 is unconnected, because it is connected to the LSI power source line 10' in common with the wires W4 and W6, a forward current flows in the surge protection diode D2. As a result, forward currents Ia, Ib and Ic flow in the surge protection diodes D1, D2 and D3.

These currents are detected by the voltage generator 12 as a current I=Ia+Ib+Ic. The forward current I flows even if the wire W5 is unconnected. When the wires W4, W5 and W6 are connected, forward currents are generated in the surge protection diodes D1, D2 and D3. When the wires W4 and W6 are connected but the wire W5 is unconnected, forward currents also are generated in the surge protection diodes D1, D2 and D3. Thus, there is no change in the amount of flowing current between the cases in which the wire W5 is unconnected or connected. As a result, the connection state of the wire W5 cannot be detected.

In the above-described example, even though the wire W5 is unconnected, forward currents flow in respective surge protection diodes when the wires W4 and W6 are connected. This is because, in the outside and the inside of the test LSI 4', a plurality of power source lines are connected in parallel between the printed board power source line 8' corresponding to an external power source line and the LSI power source line 10' corresponding to an internal power source line, which are each a single power source line. The power source line inside the chip is commonized to avoid an increase in chip cost resulting from increase in the area of the power source line when the power source line inside the chip is divided for each power source terminal.

Furthermore, the printed board power source line 8' used for inspecting the test LSI 4' is commonized for the following reason.

On the outside of the LSI, it is desired that the impedance of the power source lines existing between the voltage generator 12 and the leads L4, L5 and L6 of the test LSI 4' is decreased. Particularly, it is necessary to decrease inductance. Thus, the printed board power source line 8' is not divided to reduce the linewidth, but the power source line is commonized to design a large width.

For example, taking advantage of the characteristic of small inductance of terminals with a ceramic chip sized package (hereinafter referred to as C-CSP) or the like, the use of C-CSP to increase the operation frequency of a circuit also has been increased. Also, in the case of a circuit requiring low impedance of power source terminals, it is also necessary to reduce the parasitic impedance on the power source line of the printed board mounted with an LSI on application. Otherwise, even when a package of low impedance is used, if the parasitic impedance on the power source line of the printed board is greater than that impedance, the integrated impedance becomes high, so that the characteristic of the low impedance of the package cannot be utilized effectively.

Furthermore, the printed board for inspection also needs to have decreased power source impedance. If the parasitic impedance on the power source line of the printed board for inspection is not decreased, the same condition as the operation on application cannot be realized. Thus, inspection is not performed with high precision. That is, as the LSI is mounted in a smaller package, there is a greater necessity for designing with a decreased parasitic impedance on the power source of the printed board for inspection.

After all, LSIs in the future will have a greater number of power source terminals, and there will be a greater necessity for designing with an emphasis on the impedance contained in power source terminals, particularly inductance. When the number of power source terminals and the number of the grounding terminals of an LSI are designed with greater precision, it is necessary to inspect whether or not all power source terminals are connected. This is for the small design margin. Thus, not only is the necessity for inspecting the power source terminals in digital circuits, memory circuits, etc. inside the LSI important, but also the necessity for inspecting the power source terminals in an output circuit for transferring the calculation results of the LSI as signals to an external signal receiver is at least as important.

The necessity for inspecting the connection states of power source terminals and grounding terminals will increase more than ever. Because the operation frequency of an LSI inevitably will increase in the future, it is necessary to decrease the inductances of power source lines and grounding lines. It is necessary to realize an inspection condition close to the operation on application of the LSI. Inspection of the connections of power source terminals and grounding terminals will guarantee better quality of an LSI.

Furthermore, a shorter inspection time is more favorable. However, there has been no inspection method satisfying such requirements.

SUMMARY OF THE INVENTION

Accordingly, the present invention has been made in view of the above problems. It is an object of the present invention to provide a semiconductor device, which can realize a printed board for inspection close to the mounted state of an LSI on application, does not require many kinds of abilities of an inspection device, requires a shorter time for inspection, and can inspect the connection states of power source terminals and grounding terminals at a low cost, and an inspection method for the same.

To accomplish the above object, the present invention provides a first semiconductor device having a semiconductor integrated circuit, the first semiconductor device including: internal lines provided separately within the semiconductor integrated circuit and to each of which a different power source potential is applied from an external line provided outside the semiconductor integrated circuit; and a switch connected between the internal lines.

According to this first semiconductor device, connection states can be inspected at one time for both the wires on the side of the power source terminals and the wires on the side of the grounding terminals, and the time required for inspection can be shortened. Furthermore, because the inductances of the power source lines and grounding lines outside the semiconductor integrated circuit can be decreased, it is possible to deal with higher speed of an LSI and lower power consumption.

To accomplish the above object, the present invention provides a second semiconductor device having a semiconductor integrated circuit, the second semiconductor device including: a first internal line and a second internal line provided within the semiconductor integrated circuit; a first internal terminal, a second internal terminal, a third internal terminal, and a fourth internal terminal provided within the semiconductor integrated circuit; a first external line and a second external line provided outside the semiconductor integrated circuit; a first connection for connecting the first external line and the first internal terminal; a second connection for connecting the first external line and the second internal terminal; a third connection for connecting the second external line and the third internal terminal; a fourth connection for connecting the second external line and the fourth internal terminal; a first switch connected between the first internal terminal and the first internal line; a second switch connected between the second internal terminal and the first internal line; a third switch connected between the first internal line and the second internal line; a fourth switch connected between the third internal terminal and the second internal line; and a fifth switch connected between the fourth internal terminal and the second internal line.

According to this second semiconductor device, the connection states of power source terminals and grounding terminals can be inspected, and the time required for inspection can be shortened. Furthermore, because the inductances of the power source lines and grounding lines outside the semiconductor integrated circuit can be decreased, it is possible to deal with higher speed of an LSI and lower power consumption.

In the second semiconductor device, it is preferable that the third switch has a function of limiting a current flowing therein to a predetermined amount when the third switch is in a closed state.

Accordingly, inspection can be performed with a current not exceeding the allowable amount of current of a voltage generating circuit included in an inspection device. Furthermore, because the allowable amount of output current is not exceeded in the voltage generating circuit, an overcurrent protective circuit does not operate, and also no time is required for its recovery. Thus, the time for inspection can be shortened.

Furthermore, it is preferable that the second semiconductor device includes, within the semiconductor integrated circuit, a switch controlling section for controlling opening and closing of the first to fifth switches.

Accordingly, because the time required for opening and closing respective switches can be shortened, it is possible to shorten the time for inspection.

Furthermore, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the first internal line and the second internal line.

Accordingly, the circuits necessary for supplying a power source voltage to the switch controlling section can be reduced.

Furthermore, in the second semiconductor device, it is preferable that the second switch includes a P-channel MOS transistor, and the second semiconductor device further includes an N-channel MOS transistor within the semiconductor integrated circuit; a source terminal of the P-channel MOS transistor is connected to the second internal terminal, and a drain terminal of the P-channel MOS transistor is connected to the first internal line; and a gate terminal of the N-channel MOS transistor is connected to the second internal terminal, a source terminal of the N-channel MOS transistor is connected to the fourth internal terminal, and a drain terminal of the N-channel MOS transistor is connected to a gate terminal of the P-channel MOS transistor, such that the P-channel MOS transistor is caused to be in a conducting state when a predetermined voltage is supplied to the first external line and the second external line.

Accordingly, the second switch can be closed by supplying a predetermined voltage to the first external line and the second external line.

Furthermore, in the second semiconductor device, it is preferable that the fifth switch includes an N-channel MOS transistor, and the second semiconductor device further includes a P-channel MOS transistor within the semiconductor integrated circuit; a source terminal of the N-channel MOS transistor is connected to the fourth internal terminal, and a drain terminal of the N-channel MOS transistor is connected to the second internal line; and a gate terminal of the P-channel MOS transistor is connected to the fourth internal terminal, a source terminal of the P-channel MOS transistor is connected to the second internal terminal, and a drain terminal of the P-channel MOS transistor is connected to a gate terminal of the N-channel MOS transistor, such that the N-channel MOS transistor is caused to be in a conducting state when a predetermined voltage is supplied to the first external line and the second external line.

Accordingly, the fifth switch can be closed by supplying a predetermined voltage to the first external line and the second external line.

To accomplish the above object, the present invention provides a third semiconductor device having a semiconductor integrated circuit, the third semiconductor device including: an internal line provided within the semiconductor integrated circuit; a first internal terminal and a second internal terminal provided within the semiconductor integrated circuit; a first external line provided outside the semiconductor integrated circuit; a first connection for connecting the first external line and the first internal terminal; a second connection for connecting the first external line and the second internal terminal; a first switch connected between the first internal terminal and the internal line; a second switch connected between the second internal terminal and the internal line; and a current detecting section for detecting a current flowing in the internal line.

According to this third semiconductor device, it is not necessary to provide a current detecting circuit outside the semiconductor integrated circuit, so that the load on the inspection ability of an external inspection device can be reduced, and inspection can be carried out at a low cost.

It is preferable that the third semiconductor device includes, within the semiconductor integrated circuit, a switch controlling section for controlling opening and closing of the first and second switches.

Accordingly, because the time required for opening and closing respective switches can be shortened, it is possible to shorten the time for inspection.

In the third semiconductor device, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the internal line.

Accordingly, the circuits necessary for supplying a power source voltage to the switch controlling section can be reduced.

In the third semiconductor device, it is preferable that the second switch includes a P-channel MOS transistor, and the third semiconductor device further includes an N-channel MOS transistor within the semiconductor integrated circuit; a source terminal of the P-channel MOS transistor is connected to the second internal terminal, and a drain terminal of the P-channel MOS transistor is connected to the internal line; and a gate terminal of the N-channel MOS transistor is connected to the second internal terminal, a source terminal of the N-channel MOS transistor is connected to the second external line, and a drain terminal of the N-channel MOS transistor is connected to a gate terminal of the P-channel MOS transistor, such that the P-channel MOS transistor is caused to be in a conducting state when a predetermined voltage is supplied to the first external line and a second external line provided outside the semiconductor integrated circuit.

Furthermore, in the third semiconductor device, it is preferable that the second switch includes an N-channel MOS transistor, and the third semiconductor device further includes a P-channel MOS transistor within the semiconductor integrated circuit; a source terminal of the N-channel MOS transistor is connected to the first external line, and a drain terminal of the N-channel MOS transistor is connected to the internal line; and a gate terminal of the P-channel MOS transistor is connected to the first external line, a source terminal of the P-channel MOS transistor is connected to the second external line, and a drain terminal of the P-channel MOS transistor is connected to a gate terminal of the N-channel MOS transistor, such that the N-channel MOS transistor is caused to be in a conducting state when a predetermined voltage is supplied to the first external line and a second external line provided outside the semiconductor integrated circuit.

Accordingly, the second switch can be closed by supplying a predetermined voltage to the first external line and the second external line.

To accomplish the above object, the present invention provides a fourth semiconductor device having a semiconductor integrated circuit, the fourth semiconductor device including: an internal line provided within the semiconductor integrated circuit; a first internal terminal, a second internal terminal, and a third internal terminal provided within the semiconductor integrated circuit; a first external line and a second external line provided outside the semiconductor integrated circuit; a first connection for connecting the first external line and the first internal terminal; a second connection for connecting the first external line and the second internal terminal; a third connection for connecting the second external line and the third internal terminal; a first switch connected between the first internal terminal and the internal line; a second switch connected between the second internal terminal and the internal line; and a third switch connected between the third internal terminal and the internal line.

According to this fourth semiconductor device, the connection states of power source terminals and grounding terminals can be inspected, and the time required for inspection can be shortened. Furthermore, because the inductances of the power source lines and grounding lines outside the semiconductor integrated circuit can be decreased, it is possible to deal with higher speed of an LSI and lower power consumption.

It is preferable that the fourth semiconductor device includes, within the semiconductor integrated circuit, a switch controlling section for controlling opening and closing of the first, second and third switches.

Accordingly, because the time required for opening and closing respective switches can be shortened, it is possible to shorten the time for inspection.

In the fourth semiconductor device, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the internal line. Accordingly, the circuits necessary for supplying a power source voltage to the switch controlling section can be reduced.

Alternatively, it is preferable that a power source terminal of the switch controlling section is connected to an internal power source line connected to a power source line provided outside the semiconductor integrated circuit, and a grounding terminal of the switch controlling section is connected to the third internal terminal. Accordingly, the circuits necessary for supplying a power source voltage to the switch controlling section can be reduced further.

Alternatively, it is preferable that a grounding terminal of the switch controlling section is connected to an internal grounding line connected to a grounding line provided outside the semiconductor integrated circuit, and a power source terminal of the switch controlling section is connected to the third internal terminal. Accordingly, the circuits necessary for supplying a power source voltage to the switch controlling section can be reduced further.

In the fourth semiconductor device, it is preferable that the second switch includes a P-channel MOS transistor, and the fourth semiconductor device further includes an N-channel MOS transistor within the semiconductor integrated circuit; a source terminal of the P-channel MOS transistor is connected to the second internal terminal, and a drain terminal of the P-channel MOS transistor is connected to the internal line; and a gate terminal of the N-channel MOS transistor is connected to the second internal terminal, a source terminal of the N-channel MOS transistor is connected to the second external line, and a drain terminal of the N-channel MOS transistor is connected to a gate terminal of the P-channel MOS transistor, such that the P-channel MOS transistor is caused to be in a conducting state when a predetermined voltage is supplied to the first external line and the second external line.

Furthermore, in the fourth semiconductor device, it is preferable that the second switch includes an N-channel MOS transistor, and the fourth semiconductor device further includes a P-channel MOS transistor within the semiconductor integrated circuit; a source terminal of the N-channel MOS transistor is connected to the second internal terminal, and a drain terminal of the N-channel MOS transistor is connected to the internal line provided within the semiconductor integrated circuit; and a gate terminal of the P-channel MOS transistor is connected to the second internal terminal, a source terminal of the P-channel MOS transistor is connected to the second external line, and a drain terminal of the P-channel MOS transistor is connected to a gate terminal of the N-channel MOS transistor, such that the N-channel MOS transistor is caused to be in a conducting state when a predetermined voltage is supplied to the first external line and the second external line.

Accordingly, the second switch can be closed by supplying a predetermined voltage to the first external line and the second external line.

To accomplish the above object, the present invention provides a fifth semiconductor device having a semiconductor integrated circuit, the fifth semiconductor device including: a first internal line provided within the semiconductor integrated circuit; a first internal terminal and a second internal terminal provided within the semiconductor integrated circuit; a first external line provided outside the semiconductor integrated circuit; a second external line provided outside the semiconductor integrated circuit and connected to the first internal line; a first connection for connecting the first external line and the first internal terminal; a second connection for connecting the first external line and the second internal terminal; a first switch connected between the first internal terminal and the first internal line; and a second switch connected between the second internal terminal and the first internal line.

According to this fifth semiconductor device, the connection states of power source terminals and grounding terminals can be inspected, and the time required for inspection also can be shortened. Furthermore, because the inductances of the power source lines and grounding lines outside the semiconductor integrated circuit can be decreased, it is possible to deal with higher speed of an LSI and lower power consumption. Furthermore, an IDDQ test can be carried out easily.

It is preferable that the fifth semiconductor device includes, within the semiconductor integrated circuit, a switch controlling section for controlling opening and closing of the first and second switches.

Accordingly, because the time required for opening and closing respective switches can be shortened, it is possible to shorten the time for inspection.

In the fifth semiconductor device, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the first internal line. Accordingly, the circuits necessary for supplying a power source voltage to the switch controlling section can be reduced.

Alternatively, it is preferable that a power source terminal of the switch controlling section is connected to the first internal line, and a grounding terminal of the switch controlling section is connected to an internal grounding line connected to a grounding line provided outside the semiconductor integrated circuit. Accordingly, the circuits necessary for supplying a power source voltage to the switch controlling section can be reduced further.

Alternatively, it is preferable that a grounding terminal of the switch controlling section is connected to the first internal line, and a power source terminal of the switch controlling section is connected to an internal power source line connected to a power source line provided outside the semiconductor integrated circuit. Accordingly, the circuits necessary for supplying a power source voltage to the switch controlling section can be reduced further.

To accomplish the above object, the present invention provides a first method for inspecting a semiconductor device including: internal lines which are provided separately within the semiconductor integrated circuit and to each of which a different power source potential is applied from an external line provided outside the semiconductor integrated circuit; and a switch connected between the internal lines, which method includes: closing the switch, and inspecting a connection state between the external line and an internal terminal provided within the semiconductor integrated circuit.

According to this first method, connection states can be inspected at one time for both the wires on the side of the power source terminals and the wires on the side of the grounding terminals, and the time required for inspection can be shortened.

To accomplish the above object, the present invention provides a second method for inspecting a semiconductor device including: a first internal line and a second internal line provided within a semiconductor integrated circuit; a first internal terminal, a second internal terminal, a third internal terminal, and a fourth internal terminal provided within the semiconductor integrated circuit; a first external line and a second external line provided outside the semiconductor integrated circuit; a first connection for connecting the first external line and the first internal terminal; a second connection for connecting the first external line and the second internal terminal; a third connection for connecting the second external line and the third internal terminal; a fourth connection for connecting the second external line and the fourth internal terminal; a first switch connected between the first internal terminal and the first internal line; a second switch connected between the second internal terminal and the first internal line; a third switch connected between the first internal line and the second internal line; a fourth switch connected between the third internal terminal and the second internal line; and a fifth switch connected between the fourth internal terminal and the second internal line, which method includes: closing the first, third and fourth switches while opening the second and fifth switches; applying an inspection signal to the first external line and the second external line; and inspecting a connection state between the first external line and the first internal terminal at the first connection, and a connection state between the second external line and the third internal terminal at the third connection.

According to this second method, the connection states of power source terminals and grounding terminals can be inspected, and the time required for inspection can be shortened.

In the second method, it is preferable that the third switch has a function of limiting a current flowing therein to a predetermined amount when the third switch is in a closed state.

According to this method, inspection can be performed with a current not exceeding the allowable amount of current of a voltage generating circuit included in an inspection device. Furthermore, because the allowable amount of output current is not exceeded in the voltage generating circuit, an overcurrent protective circuit does not operate, and also no time is required for its recovery. Thus, the time for inspection can be shortened.

It is preferable that the semiconductor device in the second method includes, within the semiconductor integrated circuit, a switch controlling section for controlling opening and closing of the first to fifth switches.

According to this method, because the time required for opening and closing respective switches can be shortened, it is possible to shorten the time for inspection.

In the second method, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the first internal line and the second internal line.

According to this method, the circuits necessary for supplying a power source voltage to the switch controlling section can be reduced.

In the second method, it is preferable that the second switch includes a P-channel MOS transistor, and the semiconductor device further includes an N-channel MOS transistor within the semiconductor integrated circuit; a source terminal of the P-channel MOS transistor is connected to the second internal terminal, and a drain terminal of the P-channel MOS transistor is connected to the first internal line; a gate terminal of the N-channel MOS transistor is connected to the second internal terminal, a source terminal of the N-channel MOS transistor is connected to the fourth internal terminal, and a drain terminal of the N-channel MOS transistor is connected to a gate terminal of the P-channel MOS transistor; and the P-channel MOS transistor is caused to be in a conducting state by supplying a predetermined voltage to the first external line and the second external line.

According to this method, the second switch can be closed by supplying a predetermined voltage to the first external line and the second external line.

Furthermore, in the second method, it is preferable that the fifth switch includes an N-channel MOS transistor, and the semiconductor device further includes a P-channel MOS transistor within the semiconductor integrated circuit; a source terminal of the N-channel MOS transistor is connected to the fourth internal terminal, and a drain terminal of the N-channel MOS transistor is connected to the second internal line; a gate terminal of the P-channel MOS transistor is connected to the fourth internal terminal, a source terminal of the P-channel MOS transistor is connected to the second internal terminal, and a drain terminal of the P-channel MOS transistor is connected to a gate terminal of the N-channel MOS transistor; and the N-channel MOS transistor is caused to be in a conducting state by supplying a predetermined voltage to the first external line and the second external line.

According to this method, the fifth switch can be closed by supplying a predetermined voltage to the first external line and the second external line.

To accomplish the above object, the present invention provides a third method for inspecting a semiconductor device including: an internal line provided within the semiconductor integrated circuit; a first internal terminal and a second internal terminal provided within the semiconductor integrated-circuit; a first external line provided outside the semiconductor integrated circuit; a first connection for connecting the first external line and the first internal terminal; a second connection for connecting the first external line and the second internal terminal; a first switch connected between the first internal terminal and the internal line; a second switch connected between the second internal terminal and the internal line; and a current detecting section for detecting a current flowing in the internal line, which method includes: closing the first switch while opening the second switch; and inspecting a connection state between the first external line and the first internal terminal at the first connection according to a detection result by the current detecting section.

According to this third method, it is not necessary to provide a current detecting circuit outside the semiconductor integrated circuit, so that load on the inspection ability of an external inspection device can be reduced, and inspection can be carried out at a low cost.

It is preferable that the semiconductor device in the third method includes, within the semiconductor integrated circuit, a switch controlling section for controlling opening and closing of the first and second switches.

According to this method, because the time required for opening and closing respective switches can be shortened, it is possible to shorten the time for inspection.

In the third method, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the internal line.

According to this method, the circuits necessary for supplying a power source voltage to the switch controlling section can be reduced.

In the third method, it is preferable that the second switch includes a P-channel MOS transistor, and the semiconductor device further includes an N-channel MOS transistor within the semiconductor integrated circuit; a source terminal of the P-channel MOS transistor is connected to the second internal terminal, and a drain terminal of the P-channel MOS transistor is connected to the internal line; a gate terminal of the N-channel MOS transistor is connected to the second internal terminal, a source terminal of the N-channel MOS transistor is connected to the second external line, and a drain terminal of the N-channel MOS transistor is connected to a gate terminal of the P-channel MOS transistor; and the P-channel MOS transistor is caused to be in a conducting state by supplying a predetermined voltage to the first external line and a second external line provided outside the semiconductor integrated circuit.

Furthermore, in the third method, it is preferable that the second switch includes an N-channel MOS transistor, and the semiconductor device further includes a P-channel MOS transistor within the semiconductor integrated circuit; a source terminal of the N-channel MOS transistor is connected to the first external line, and a drain terminal of the N-channel MOS transistor is connected to the internal line; a gate terminal of the P-channel MOS transistor is connected to the first external line, a source terminal of the P-channel MOS transistor is connected to the second external line, and a drain terminal of the P-channel MOS transistor is connected to a gate terminal of the N-channel MOS transistor; and the N-channel MOS transistor is caused to be in a conducting state by supplying a predetermined voltage to the first external line and a second external line provided outside the semiconductor integrated circuit.

Accordingly, the second switch can be closed by supplying a predetermined voltage to the first external line and the second external line.

To accomplish the above object, the present invention provides a fourth method for inspecting a semiconductor device including: an internal line provided within the semiconductor integrated circuit; a first internal terminal, a second internal terminal, and a third internal terminal provided within the semiconductor integrated circuit; a first external line and a second external line provided outside the semiconductor integrated circuit; a first connection for connecting the first external line and the first internal terminal; a second connection for connecting the first external line and the second internal terminal; a third connection for connecting the second external line and the third internal terminal; a first switch connected between the first internal terminal and the internal line; a second switch connected between the second internal terminal and the internal line; and a third switch connected between the third internal terminal and the internal line, which method includes: closing the first and third switches while opening the second switch; and inspecting a connection state between the first external line and the first internal terminal at the first connection.

According to this fourth method, the connection states of power source terminals and grounding terminals can be inspected, and the time required for inspection can be shortened.

It is preferable that the semiconductor device in the fourth method includes, within the semiconductor integrated circuit, a switch controlling section for controlling opening and closing of the first, second and third switches.

According to this method, because the time required for opening and closing respective switches can be shortened, it is possible to shorten the time for inspection.

In the fourth method, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the internal line. According to this method, the circuits necessary for supplying a power source voltage to the switch controlling section can be reduced.

Alternatively, it is preferable that a power source terminal of the switch controlling section is connected to an internal power source line connected to a power source line provided outside the semiconductor integrated circuit, and a grounding terminal of the switch controlling section is connected to the third internal terminal. According to this method, the circuits necessary for supplying a power source voltage to the switch controlling section can be reduced further.

Alternatively, it is preferable that a grounding terminal of the switch controlling section is connected to an internal grounding line connected to a grounding line provided outside the semiconductor integrated circuit, and a power source terminal of the switch controlling section is connected to the third internal terminal. According to this method, the circuits necessary for supplying a power source voltage to the switch controlling section can be reduced further.

In the fourth method, it is preferable that the second switch includes a P-channel MOS transistor, and the semiconductor device further includes an N-channel MOS transistor within the semiconductor integrated circuit; a source terminal of the P-channel MOS transistor is connected to the second internal terminal, and a drain terminal of the P-channel MOS transistor is connected to the internal line; a gate terminal of the N-channel MOS transistor is connected to the second internal terminal, a source terminal of the N-channel MOS transistor is connected to the second external line, and a drain terminal of the N-channel MOS transistor is connected to a gate terminal of the P-channel MOS transistor; and the P-channel MOS transistor is caused to be in a conducting state by supplying a predetermined voltage to the first external line and the second external line.

Furthermore, in the fourth method, it is preferable that the second switch includes an N-channel MOS transistor, and the semiconductor device further includes a P-channel MOS transistor within the semiconductor integrated circuit; a source terminal of the N-channel MOS transistor is connected to the second internal terminal, and a drain terminal of the N-channel MOS transistor is connected to the internal line provided within the semiconductor integrated circuit; a gate terminal of the P-channel MOS transistor is connected to the second internal terminal, a source terminal of the P-channel MOS transistor is connected to the second external line, and a drain terminal of the P-channel MOS transistor is connected to a gate terminal of the N-channel MOS transistor; and the N-channel MOS transistor is caused to be in a conducting state by supplying a predetermined voltage to the first external line and the second external line.

Accordingly, the second switch can be closed by supplying a predetermined voltage to the first external line and the second external line.

To accomplish the above object, the present invention provides a fifth method for inspecting a semiconductor device including: a first internal line provided within the semiconductor integrated circuit; a first internal terminal and a second internal terminal provided within the semiconductor integrated circuit; a first external line provided outside the semiconductor integrated circuit; a second external line provided outside the semiconductor integrated circuit and connected to the first internal line; a first connection for connecting the first external line and the first internal terminal; a second connection for connecting the first external line and the second internal terminal; a first switch connected between the first internal terminal and the first internal line; and a second switch connected between the second internal terminal and the first internal line, which method includes: closing the first switch while opening the second switch; applying an inspection signal from the first external line to the second external line; and inspecting a connection state between the first external line and the first internal terminal at the first connection.

According to the fifth method, the connection states of power source terminals and grounding terminals can be inspected, and the time required for inspection also can be shortened. Furthermore, an IDDQ test can be carried out easily.

It is preferable that the semiconductor device in the fifth method includes, within the semiconductor integrated circuit, a switch controlling section for controlling opening and closing of the first and second switches.

According to this method, because the time required for opening and closing respective switches can be shortened, it is possible to shorten the time for inspection.

In the fifth method, it is preferable that a power source terminal of the switch controlling section is connected to an internal power source line connected to a power source line provided outside the semiconductor integrated circuit; a grounding terminal of the switch controlling section is connected to an internal grounding line connected to a grounding line provided outside the semiconductor integrated circuit; and at least one of the internal power source line and the internal grounding line is separated from the first internal line. According to this method, the circuits necessary for supplying a power source voltage to the switch controlling section can be reduced.

Alternatively, it is preferable that a power source terminal of the switch controlling section is connected to the first internal line, and a grounding terminal of the switch controlling section is connected to an internal grounding line connected to a grounding line provided outside the semiconductor integrated circuit. According to this method, the circuits necessary for supplying a power source voltage to the switch controlling section can be reduced further.

Alternatively, it is preferable that a grounding terminal of the switch controlling section is connected to the first internal line, and a power source terminal of the switch controlling section is connected to an internal power source line connected to a power source line provided outside the semiconductor integrated circuit. According to this method, the circuits necessary for supplying a power source voltage to the switch controlling section can be reduced further.

DETAILED DESCRIPTION OF PREFERRED EMBODIMENTS

In the following, preferred embodiments of the present invention are described with reference to the accompanied drawings.

First Embodiment

Figure 1:
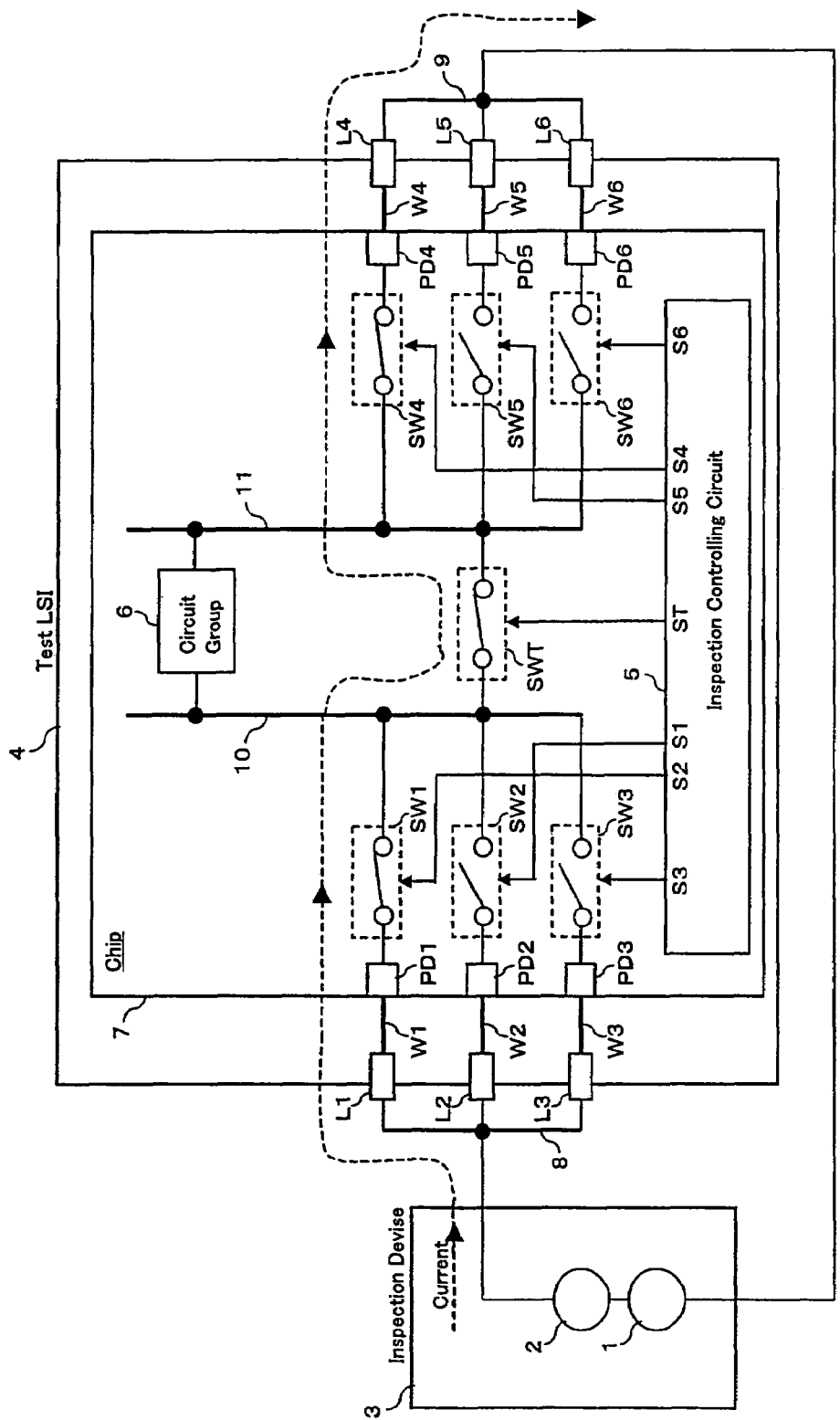
FIG. 1 is a block diagram showing a basic configuration of a test LSI and an inspection device thereof according to a first embodiment of the present invention.

FIG. 1 is a basic configuration of a test LSI and an inspection device thereof according to a first embodiment of the present invention.

In FIG. 1, numeral 1 denotes a voltage source; numeral 2 denotes an ammeter for measuring an output current of the voltage source 1; numeral 3 denotes an inspection device; numeral 4 denotes a test LSI; and numeral 5 denotes an inspection controlling circuit (a switch controlling section). Numeral 6 denotes a circuit group connected between a power source line 10 (a first internal line) and a grounding line 11 (a second internal line) of the LSI. The circuit group 6 is, for example, a circuit including a plurality of digital circuits, such as a multiplier. Numeral 7 denotes a semiconductor chip (hereinafter referred to as a chip).

The power source terminals of the test LSI 4 comprise leads L1, L2 and L3, wires W1, W2 (first and second connections), and W3, and pads PD1, PD2 (first and second internal terminals), and PD3. The grounding terminals of the test LSI 4 comprise leads L4, L5 and L6, wires W4, W5 (third and fourth connections), and W6, and pads PD4, PD5 (third and fourth internal terminals), and PD6. Then, a power source line 8 (a first external line) and a grounding line 9 (a second external line) of a printed board outside the test LSI 4 are connected respectively to the leads L1 to L3 and the leads 4 to 6 of the package. The leads L1 to L6 of the package and the pads PD1 to PD6 of the chip 7 are connected with the wires W1 to W6.

Switches SW1 (a first switch), SW2 (a second switch) and SW3 are connected respectively between the pads PD1, PD2 and PD3 on the power source side and the power source line 10 of the LSI. On the other hand, switches SW4 (a fourth switch), SW5 (a fifth switch) and SW6 are connected respectively between the pads PD4, PD5 and PD6 on the grounding side and the grounding line 11 of the LSI. In addition, a switch SWT (a third switch) is connected between the power source line 10 and the grounding line 11 of the LSI. An operating current is supplied to the circuit group 6 within the chip 7 through the power source line 10 and the grounding line 11 of the LSI.

Next, the sealed state of the chip 7 in a package forming the test LSI 4 is described.

For example, when the chip 7 is sealed with a plastic package, wires are used to electrically connect the pads of the chip 7 and the leads of the package. After the wires are connected between the pads and the leads, the chip is sealed with a plastic. When the connection of a wire with a pad or lead is made inappropriately, the wire may be separated from the lead or pad in the process of sealing the chip 7 in the plastic package. Thus, after the chip 7 is sealed in the plastic package, it is necessary to inspect whether or not the connection of the wire is made appropriately.

Next, a method for inspecting the connection states of wires is described.

Referring to FIG. 1, a procedure for inspecting the connection states of the wires W1 and W4 is described. First, the switches SW1, SW4 and SWT are closed, and the switches SW2, SW3, SW5 and SW6 are opened. Opening and closing of these switches are controlled by the inspection controlling circuit 5. In this case, a current shown by arrows in the drawing flows from the voltage source 1 in the inspection device 3. As illustrated, this current flows from the power source line 8 of the printed board to the grounding line 9 of the printed board through the interior of the test LSI 4. Because only the switches SW1, SWT and SW4 are in the closed state, the path of the current is limited only to that passing through the switches SW1, SWT and SW4. Accordingly, the connection states of the wires W1 and W4 can be inspected by detecting whether or not a current flows when the voltage source 1 is applied to the power source line 8 and the grounding line 9 of the printed board.

When both of the wires W1 and W4 are connected between the pads PD1 and PD4 and the leads L1 and L4, a current outputted from the voltage source 1 flows. On the other hand, when at least one of the wires W1 and W4 is unconnected, no current flows when a voltage is supplied to the power source line 8 and the grounding line 9 of the printed board. Whether or not a current outputted from the voltage source 1 has flowed is detected by the ammeter 2. When a current is detected by the ammeter 2, it is found that the wires W1 and W4 are connected. When no current is detected, it is found that one or both of the wires W1 and W4 are unconnected.

By the way, although it is detected that one or both of the wires W1 and W4 is unconnected as no current flows when the voltage source 1 is applied, it is not necessary to specify which of the wires W1 and W4 is unconnected. The reason is as follows. It is satisfactory as long as an LSI in which all of the power source terminals and grounding terminals are connected can be differentiated from an LSI in which any one of the power source terminals and grounding terminals is unconnected. If any one of the terminals is unconnected, the LSI is defective.

However, when there is a need for specifying the unconnected terminal, the unconnected wire can be specified by taking together the open and closed states of the switches with the result of detecting current. For example, to specify which of the wires W1 and W4 is unconnected, it is necessary to combine the above-described inspection with the result of the following inspection.

As a second inspection, the switches SW1, SW5 and SWT are closed, the switches SW2, SW3, SW4 and SW6 are opened, and it is inspected whether a current flows from the voltage source 1. If a current flows, it is determined that the leads L1 and L5 are connected. Thus, taking together with the result of previous inspection, it can be specified that the lead L4 is unconnected.

On the other hand, if again no current flows in the second inspection, the open and closed states of the switches in the second inspection are converted into the condition in which the switch SW5 is in the open state and the switch SW6 is in the closed state, and whether a current flows is inspected. If a current flows, taken together with the results of previous two inspections, it is found that the lead L4 is unconnected. On the other hand, if no current flows, it is found that the lead L1 is unconnected.

However, if no current is detected in all of the three inspections, taking into account the assumption that the chance of all of the leads L4, L5 and L6 being unconnected is extremely small, it is determined that the lead L1 is unconnected. That is, if no current is detected in all of the three inspections, logically, it cannot be specified whether the lead L1 is unconnected or all of the leads L4, L5 and L6 are unconnected. However, when considering that the possibility of all of the leads L4, L5 and L6 being unconnected is very small, it is possible to specify that the lead L1 is unconnected.

Inspection of the remaining wires W2, W3, W5 and W6 is performed in the same manner as the connection inspection of the wires W1 and W4. To detect the connection states of the wires W2 and W5, the switches SW2, SW5 and SWT are closed, the switches SW1, SW3, SW4 and SW6 are opened, and a current outputted from the voltage source 1 is detected by the ammeter 2. To inspect the connection states of the wires W3 and W6, the switches SW3, SW6 and SWT are closed, the switches SW1, SW2, SW4 and SW5 are opened, and a current outputted from the voltage source 1 is detected by the ammeter 2.

The role of the switches SW1 to SW3 and the switches SW4 to SW6 is to limit the path of the current from the voltage source 1 only to the wires to be inspected among the wires W1 to W3 and the wires W4 to W6 connected in parallel. The switch SWT has the role of forming the path of a current supplied from the voltage source 1 that passes from the power source line 10 to the grounding line 11 of the LSI. Furthermore, the switch SWT has the role of enabling both of the wire on the side of the power source terminal and the wire on the side of the grounding terminal to be inspected at one time.

In the above, the case in which three terminals are connected to each of the power source terminal and the grounding terminal of the chip 7 is described with reference to FIG. 1. However, when either one of the power source terminal and the grounding terminal is single, the need for the switches SW1 to SW3 or the switches SW4 to SW6 connected to side of the single terminal is eliminated. For example, when the grounding terminal is single, the switches SW4 to SW6 are not needed, and a single pad may be connected directly to the grounding line of the LSI without inserting a switch.

Second Embodiment

As a second embodiment of the present invention, connection inspection of an LSI comprising a CMOS transistor is described with reference to FIGS. 2 and 3.

Figure 2:
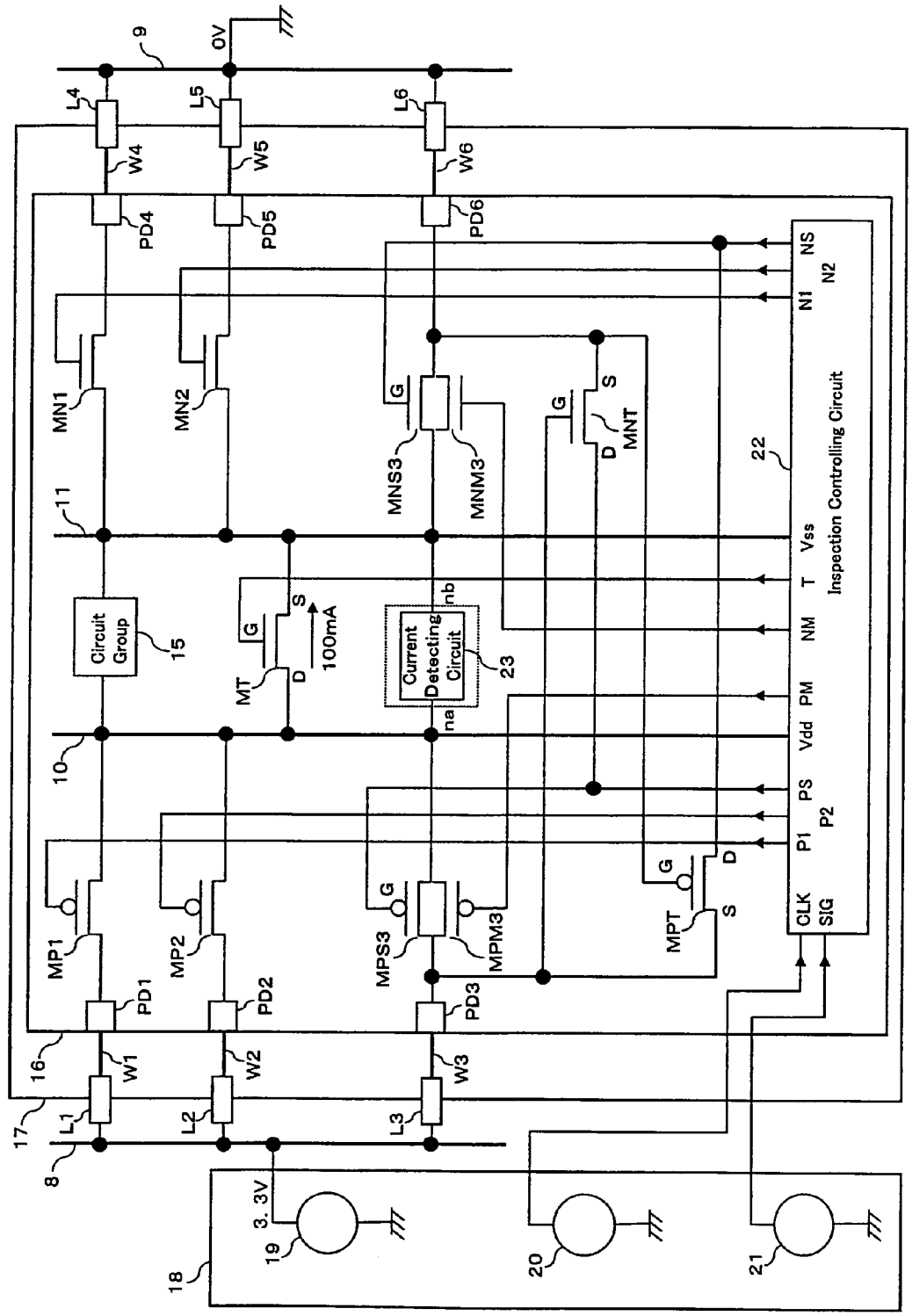
FIG. 2 is a block diagram showing a configuration of a test LSI and an inspection device thereof according to a second embodiment of the present invention.

FIG. 2 is a configuration of a test LSI and an inspection device thereof according to the second embodiment of the present invention.

First, the configuration shown in FIG. 2 is described. Numeral 19 denotes a voltage generator including a voltage source and an ammeter for measuring a current outputted from the voltage source, numeral 20 denotes a clock generator, and numeral 21 denotes a signal source. Numeral 18 denotes an inspection device, which contains the voltage generator 19, the clock generator 20 and the signal source 21. Numeral 22 denotes an inspection controlling circuit (a switch controlling section), numeral 17 denotes a test LSI, and numeral 16 denotes a chip. A power source line 8 (a first external line) and a grounding line 9 (a second external line) of a printed board are provided to connect the test LSI 17 and the inspection device 18. The printed board and the inspection device 18 are located outside the test LSI 17.

The test LSI 17 includes three power source terminals. The power source line 8 of the printed board and the power source line 10 of the LSI (a first internal line) are connected with leads L1, L2 and L3, wires W1, W2 (first and second connections), and W3, and pads PD1 (a first internal terminal), PD2, and PD3 (a second internal terminal). Switches MP1 (a first switch), MP2, and MPS3/MPM3 (a second switch) comprising PMOS transistors are connected between corresponding pads PD1, PD2 and PD3, and the power source line 10 (the first internal line) of the LSI. The configuration on the grounding terminal side is the same as that on the power source terminal side, except that switches MN1 (a fourth switch), MN2, and MNS3/MNM3 (a fifth switch) are not PMOS, but NMOS transistors. The switches MN1, MN2, and MNS3/MNM3 are connected between corresponding pads PD4 (a third internal terminal), PD5 and PD6 (a fourth internal terminal), and a grounding line 11 (a second internal line) of the LSI. The leads L1 to L6 are terminals that can be connected to the exterior of the test LSI 17. The leads L1 to L3 are electrically connected to the power source line 8 of the printed board, and the leads L4 to L6 are electrically connected to the grounding line 9 of the printed board.

A switch MT (a third switch) is connected between the power source line 10 and the grounding line 11 of the LSI.

A source terminal S of a switch MPT (a P-channel MOS transistor) and a gate terminal G of a switch MNT (an N-channel MOS transistor) are connected to the connection between the switches MPS3/MPM3 and the pad PD3. A source terminal S of the switch MNT and a gate terminal G of the switch MPT are connected to the connection between the switches MNS3/MNM3 and the pad PD6. A drain terminal D of the switch MNT is connected to a gate terminal G of the switch MPS3. A drain terminal D of the switch MPT is connected to a gate terminal G of the switch MNS3.

The power source line 10 and the grounding line 11 of the LSI are connected to a circuit group 15 inside the test LSI 17 and supply an operating current. The circuit group 15 is the same as the circuit group 6 in FIG. 1 and is, for example, a digital circuit group including many logic circuits such as a multiplier or a decoder. The operating current of the inspection controlling circuit 22 is supplied to a Vdd terminal and a Vss terminal from the power source line and the grounding line of the LSI.

The resistances of the switches MP1, MP2 and MPM3, and the switches MT, MN1, MN2 and MNM3 in the closed state may be at the same level as that of the final stage transistor in an output circuit provided at a signal output terminal for driving the load capacitor of the exterior of the test LSI 17. The driving forces of the switches MPS3, MNS3, MPT and MNT may be sufficiently smaller than those of the switches MP1, MP2 and MPM3 and the switches MT, MN1, MN2 and MNM3.

The area of each switch is the same or smaller than that of the final stage transistor in the output circuit. Therefore, respective switches can be arranged in the power source terminal block and the grounding terminal block with the area of the circuit block at the output terminal in which the output circuit is formed. Because the size of the power source terminal block and the grounding terminal block is originally the same as that of the output terminal block, the switches necessary for inspection do not increase the chip area of the test LSI 17. Because the inspection controlling circuit 22 can be formed with a small number of logic circuits, it can be placed in a space area in the power source terminal block and the grounding terminal block. Thus, the chip area is not increased by placing the transistors necessary for inspection on the test LSI 17.

Next, the procedure for inspecting the connections of the power source terminals and the grounding terminals is described in detail with reference to FIGS. 2 and 3.

Figure 3:
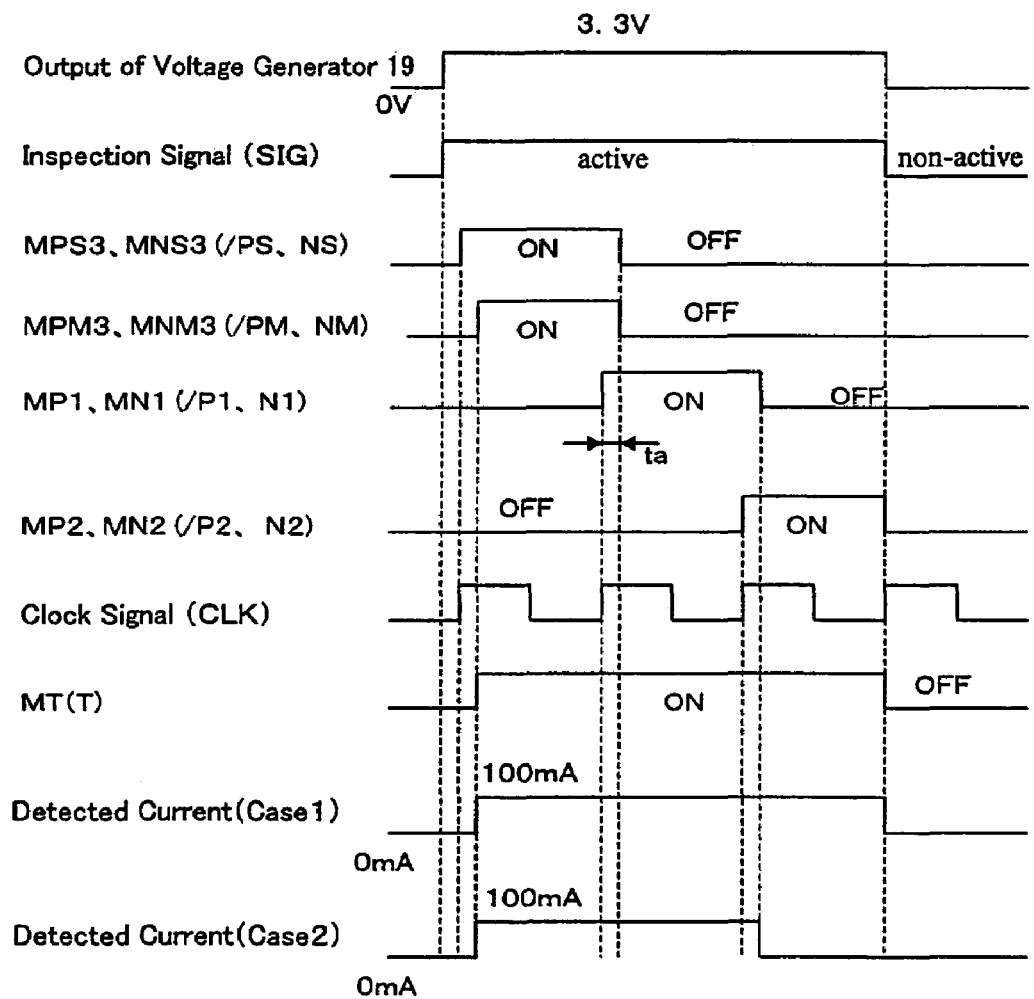
FIG. 3 is a timing chart showing the opening and closing of respective switches at the time of connection inspection according to the second embodiment of the present invention.

FIG. 3 is a timing chart showing the states of actions at the time of inspection. In FIG. 3, the signals P1, P2, PS and PM are shown by inverted signals.

First, to inspect the connections of the power source terminals and grounding terminals of the test LSI 17, a voltage is supplied from the voltage generator 19 to the test LSI 17. The supplied voltage is 3.3 V. For example, when the wires W3 and W6 are connected between the pads PD3 and PD6 and the leads L3 and L6, a voltage of 3.3 V is supplied between the source terminal S and the gate terminal G of the switch MPT, and also a voltage of 3.3 V is supplied between the source terminal S and the gate terminal G of the switch MNT. As a result, the switches MPT and MNT are brought into the conducting state, and the voltage of the gate terminal G of the switch MPS3 becomes 0 V, and the voltage of the gate terminal G of the switch MNS3 becomes 3.3 V. Thus, the switches MPS3 and MNS3 are converted into the conducting state. By bringing the switches MPS3 and MNS3 into the conducting state, voltages of 3.3 V and 0 V are supplied to the power source line 10 and the grounding line 11 of the LSI, respectively.

Because the Vdd terminal and the Vss terminal of the inspection controlling circuit 22 are connected respectively to the power source line 10 and the grounding line 11 of the LSI, when the wires W3 and W6 are connected, a voltage is supplied to the inspection controlling circuit 22 to bring it into the active state. On the other hand, when the wires W3 and W6 are unconnected, no voltage is supplied to the inspection controlling circuit 22, so that it is in the non-active state. And the switches MPM3, MNM3 and MT are converted into the closed state by the signals PM, NM and T from a switch driving circuit included in the inspection controlling circuit 22.

When the wires W3 and W6 are connected, a current outputted from the voltage generator 19 flows into the ground GND through the wire W3, the switches MPS3/MPM3, MT and MNS3/MNM3, and the wire W6. At this time, when a voltage of 3.3 V is supplied to the gate terminal G of the switch MT, a voltage of 0 V is supplied to the source terminal S of the switch MT, and a voltage of 3.3 V is supplied to the drain terminal D of the switch MT, if the current flowing between the drain terminal D and the source terminal S is limited to 100 mA, then a current of 100 mA is detected by the ammeter included in the voltage generator 19. The conducting resistances of the parallel switches MPS3/MPM3 and the parallel switches MNS3/MNM3 are considered as zero. Furthermore, the current detected by the voltage generator 19 also includes the operating current of the inspection controlling circuit 22, although the current consumed by the inspection controlling circuit 22 is ignored as it is very small. After all, when the wires W3 and W6 are connected, a current of 100 mA is detected by the voltage generator 19. And when the wires W3 and W6 are unconnected, no current is detected.

At this time, the current flowing in the switch MT is limited to 100 mA so as not to exceed the current output ability of the voltage generator 19. When a current of 2 A flows in the switch MT, if the current output ability of the voltage generator 19 is 1 A at a maximum, then an overcurrent protective circuit of the voltage generator 19 operates. When the overcurrent protective circuit operates, it takes time until the voltage generator 19 returns to its normal operation. Because the time required for returning increases the time for inspection, the maximum current flowing in the switch MT is set to 100 mA so that the current output ability of the voltage generator 19 may not be exceeded.

Furthermore, inspection can be carried out with a current not exceeding the allowable current of the wires. The current at the time of inspection also can be limited by the current when the switches MP1, MP2, MPS3/MPM3, MN1, MN2, MNS3 and MNM3 are in the conducting state. However, because these switches become parasitic resistances on the power source line and the grounding line when the circuit group 15 is in normal operation, these switches are designed such that a large current may flow with a resistance as little as possible when conducting. Accordingly, the current cannot be limited by the switches MP1, MP2, MPS3/MPM3, MN1, MN2 and MNS3/MNM3. Thus, the switch MT, which is open at the time of normal operation and is closed at the time of inspection, may limit the current when conducting.

Next, to confirm the connections of the wires W1 and W4, the switches MP1 and MN1 are closed by signals P1 and N1 from the inspection controlling circuit 22. The switch MT remains closed. Then, the switches MPS3, MPM3, MNS3 and MNM3 are opened respectively by signals PS, PM, NS and NM from the inspection controlling circuit 22. The switches MP2 and MN2 remain open. At this time, the drain terminals D of the switches MNT and MPT are connected to the gate terminals G of the switches MPS3 and MNS3. The switches MPT and MNT are in the closed state because voltages of 0 V and 3.3 V are supplied to their respective gate terminals. Thus, a voltage of 0 V from the GND via the switch MNT, and a voltage of 3.3 V from the voltage generator 19 via the switch MPT are supplied respectively to the gate terminals G of the switches MPS3 and MNS3, so that the switches MPS3 and MNS3 are in the closed state.

Then, to the gate terminals G of the switches MPS3 and MNS3, voltages of 3.3 V and 0 V are supplied respectively, as signals PS and NS, from the driving circuit in the inspection controlling circuit 22 having a driving force that is sufficiently stronger than the driving forces of the switches MPT and MNT. That is, MPS3 and MNS3 are opened.

Furthermore, in the opening and closing actions of the switches, it is necessary to close the switches MP1 and MN1 before opening the switches MPS3, MNS3, MPM3 and MNM3. This is to prevent temporal interruption of the voltage of 3.3 V from the voltage generator 19 to the inspection controlling circuit 22 by providing an overlapping period ta (see FIG. 3) for the period in which the switches MPS3, MPM3, MNS3 and MNM3 are closed and the period in which the switches MP1 and MN1 are closed. That is, it is ensured that the open states of the switches MPS3, MPM3, MNS3 and MNM3 do not exist simultaneously with the open states of the switches MP1 and MN1. The signals P1, P2, PS, PM, N1, N2, NS and NM are generated based on to the clock signal CLK of the clock generator 20.

When the wires W1 and W4 are connected, the current outputted from the voltage generator 19 flows into the ground GND through the wire W1, the switches MP1, MT and MN1, and the wire W4. This current is detected by the ammeter in the voltage generator 19. On the other hand, when one or both of the wires W1 and W4 are unconnected, no current is detected.

Next, when the connections of the wires W2 and W5 are inspected, the switches MP2, MN2 and MT are closed, the switches MP1, MPS3, MPM3, MN1, MNS3 and MNM3 are opened, and a current outputted from the voltage generator 19 is detected. Because this inspection is carried out in the same manner as the inspection of the wires W1 and W4, detailed explanation thereof is omitted.

FIG. 3 shows cases 1 and 2 as current patterns detected by the ammeter in the voltage generator 19. The case 1 is when the wires W1 to W6 are connected, and the case 2 is when one or both of the wires 2 and W5 are unconnected.

By forming the inspection controlling circuit 22 in the test LSI 17, the wiring capacitance when driving the switches MP1, MP2, MPS3, MPM3, MN1, MN2, MNS3 and MNM3 can be reduced. Therefore, opening and closing of respective switches can be carried out within a short time, and the time for inspection is shortened. Furthermore, because the signals P1, P2, PS, PM, T, N1, N2, NS and NM are generated inside the chip, the test LSI 17 does not need an input signal terminal. However, it is not always necessary to include the inspection controlling circuit 22 in the test LSI 17. Even when the inspection controlling circuit 22 is present outside the test LSI 17, inspection of the connections of the power source terminals and the grounding terminals is not inhibited.

Figure 4:
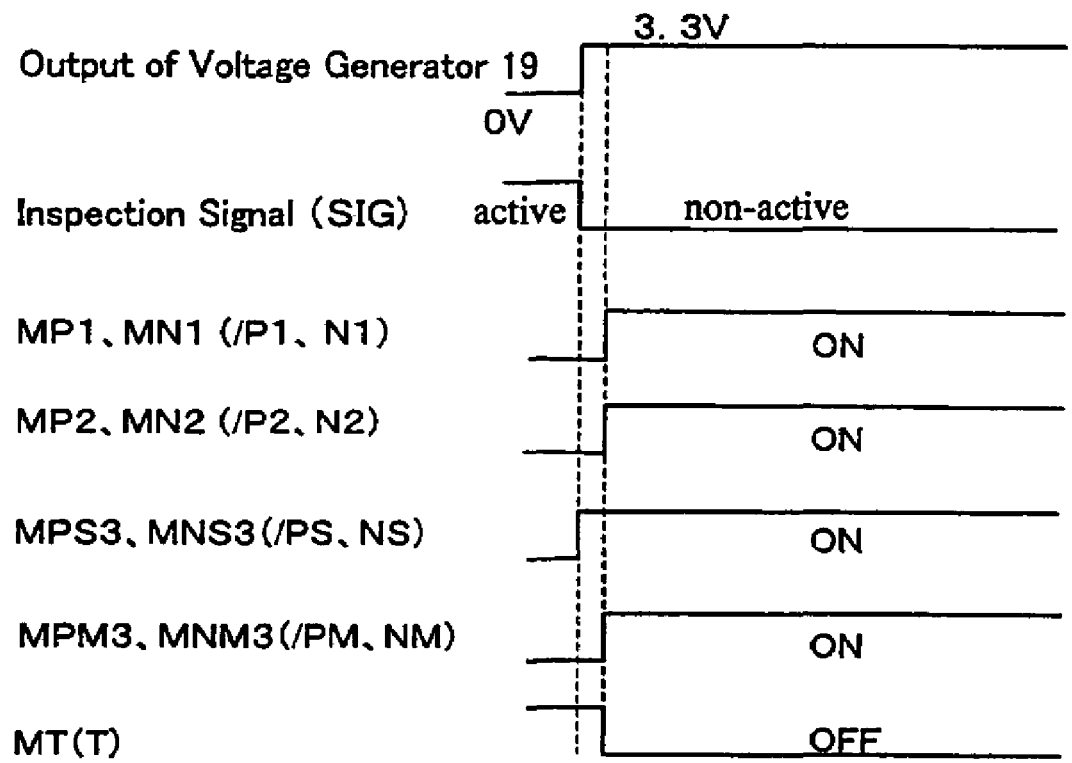
FIG. 4 is a timing chart showing the opening and closing of respective switches at the time of normal operation according to the second embodiment of the present invention.

FIG. 4 is a timing chart showing the open and closed states of respective switches when the test LSI 17 is in normal operation. In FIG. 4, signals P1, P2, PS and PM are shown by inverted signals.

At the time of normal operation, when a voltage of 3.3 V is supplied from the voltage generator 19, the switches MPS3 and MNS3 are closed by the switches MPT and MNT. A voltage of 3.3 V is supplied to the voltage controlling circuit 22, and by a driving circuit included in the inspection controlling circuit 22, the switches MP1, MN1, MP2, MN2, MPM3 and MNM3 are closed, and the switch MT is opened.

Whether the test LSI 17 is at inspection operation or normal operation is determined by the inspection signal SIG from the signal source 21. When the inspection signal SIG is inputted, it is at inspection operation. When no inspection signal is inputted, it is at normal operation.

Furthermore, the switches MPS3 and MNS3 are circuits for supplying a voltage to the power source line and the grounding line of the LSI by power-on to the test LSI 17. The gate terminals G of the switches MPS3 and MNS3 are driven respectively by the switches MNT and MPT with a small driving force. To shorten the time required for opening and closing the switches MPS3 and MNS3, it is better to design each of them to decrease the input capacitance of a gate terminal G, rather than to decrease the resistance in the closed state. To decrease the resistance in the closed state, the switches MPM3 and MNM3 connected in parallel to the switches MPS3 and MNS3 are closed.

When it is necessary to keep the switches MPS3 and MNS3 open, a stationary current flows in the switches MPT and MNT. This is because the gate terminals G of the switches MPS3 and MNS3 are set respectively to 3.3 V and 0 V by the driving circuit in the inspection controlling circuit 22 having a stronger driving force than those of the switches MPT and MNT. Therefore, the current of the driving circuit flows in the switches MPT and MNT in the conducting state.

Furthermore, when the switches MP1, MP2, MPS3, MPM3, MN1, MN2, MNS3 and MNM3 are opened to interrupt the static current of the circuit group 15 and reduce current consumption at the time of static operation, the switches MPS3 and MNS3 may be assigned to the power source terminals of a circuit group that may be in the closed state. Or the switches MPS3 and MNS3 may be assigned to the power sources of a circuit group having a small static current.

Furthermore, as a means for detecting the output current of the voltage generator 19, a circuit for detecting a current flowing in the power source line 10 and the grounding line 11 of the LSI, such as the current detecting circuit 23 surrounded by a broken line in FIG. 2, may be provided. Or a circuit for detecting a current by detecting a change in the voltage of the power source line 10 and the grounding line 11 of the LSI may be provided. In these cases, the switch MT may be removed.

Figure 14:
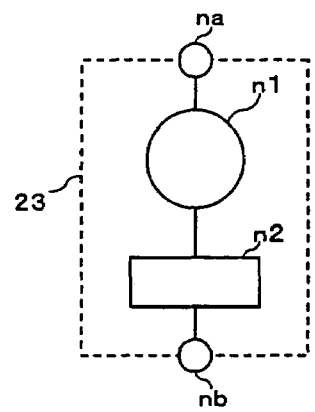
FIG. 14 is a diagram showing a schematic configuration of a current detecting circuit in an embodiment of the present invention.

To detect a current flowing in the power source line 10 and the grounding line 11 of the LSI, an ammeter may be provided between the terminal na and the terminal nb of the current detecting circuit 23. Furthermore, as shown in FIG. 14, an ammeter n1 and a constant voltage source n2 connected in series may be connected between the terminal na and the terminal nb.

Figure 15:
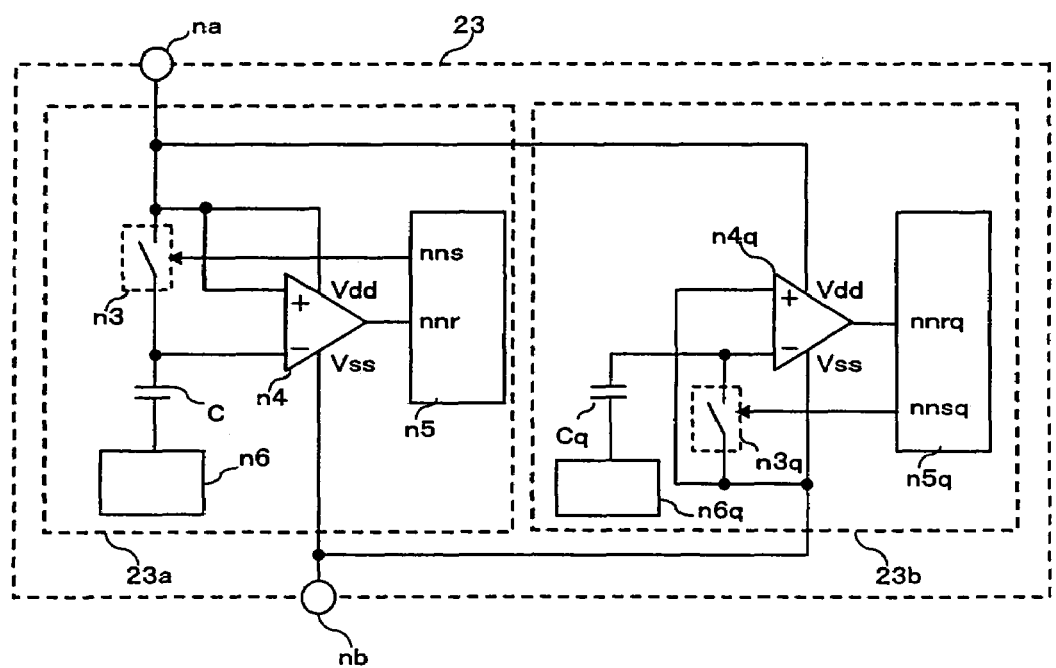
FIG. 15 is a circuit diagram showing a configuration of a voltage change detecting circuit as a modified example of a current detecting circuit in an embodiment of the present invention.
Figure 16:
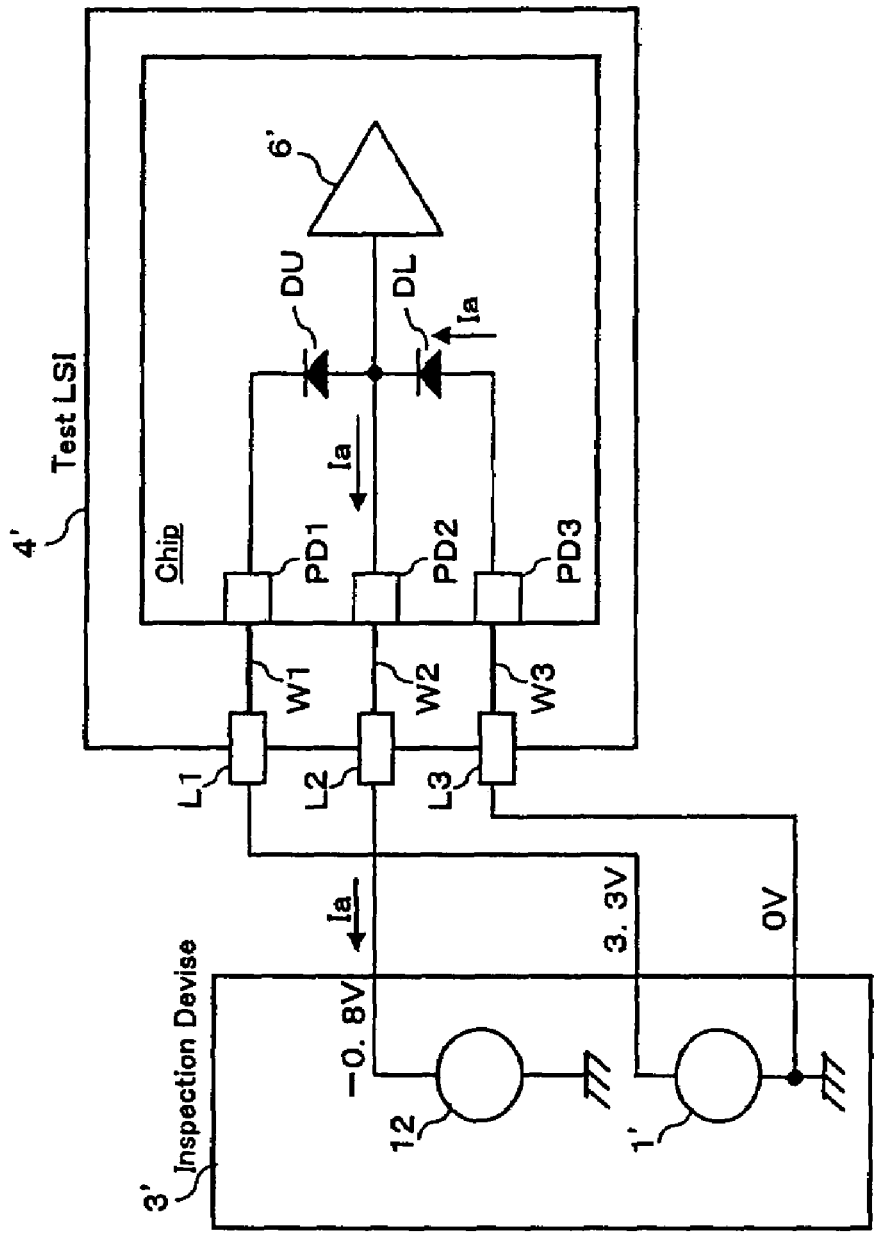
FIG. 16 is a diagram showing a configuration of a test LSI and an inspection device thereof relating to a conventional method for inspecting connections of signal lines.
Figure 17:
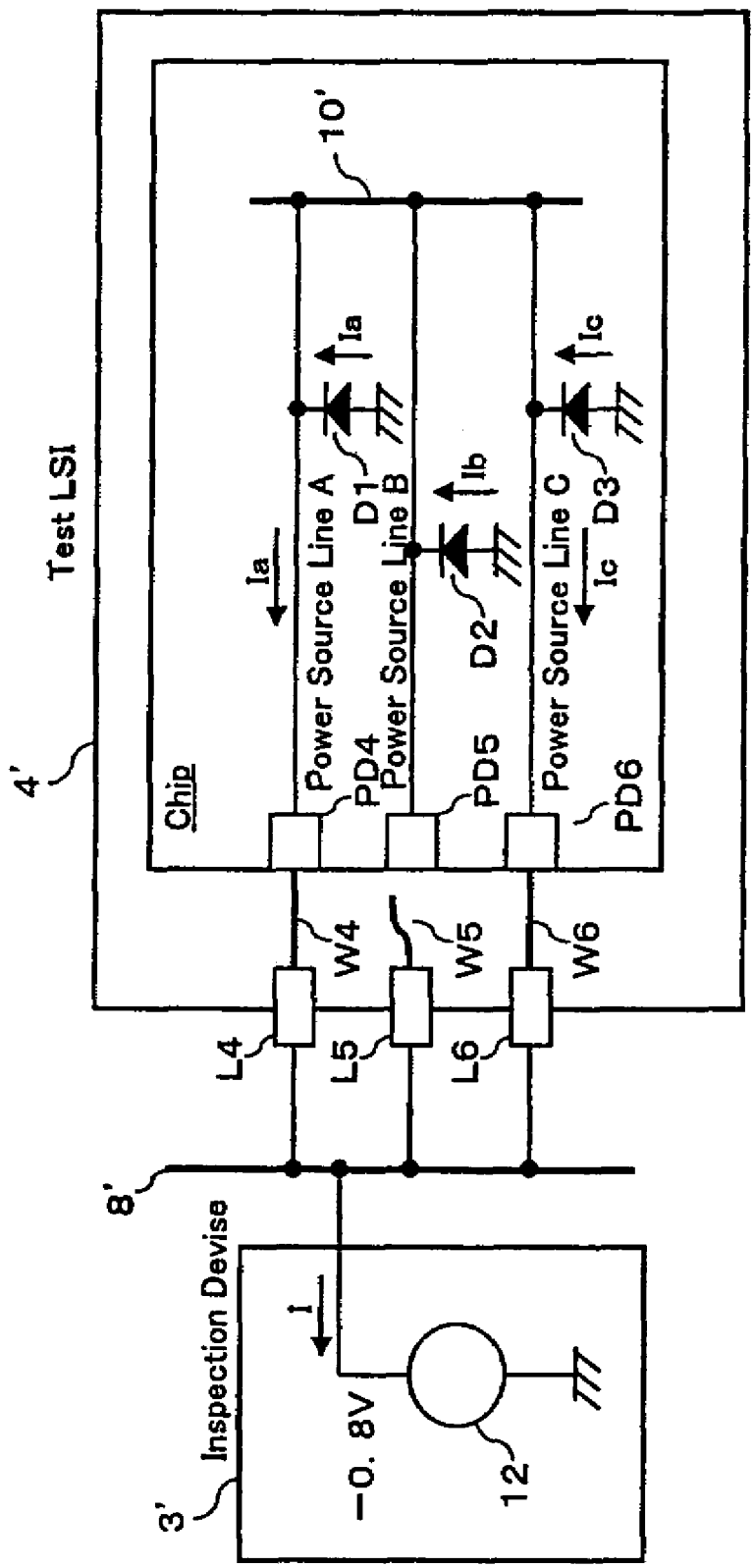
FIG. 17 is a diagram showing a configuration of a test LSI and an inspection device thereof relating to a conventional method for inspecting connections of power source lines.

FIG. 15 shows an example of a circuit for detecting change in voltage. In FIG. 15, change in the voltage in the power source line 10 of the LSI is detected by a section 23a surrounded by a broken line. Symbol n3 denotes a switch; C denotes a capacitor; n4 denotes a voltage comparator; n5 denotes a switch control and logic circuit; and n6 denotes a constant voltage source. To a voltage terminal Vdd and a grounding terminal Vss of the voltage comparator n4, an operating voltage is supplied from terminals na and nb. In the switch control and logic circuit n5, the opening and closing of the switch n3 is controlled by a signal nns, and an output signal of the voltage comparator n4 is received by a terminal nnr. One terminal of the capacitor C is connected to the constant voltage source n6. However, it also may be connected to the ground potential, instead of the constant voltage source n6.

In FIG. 15, change in the voltage in the grounding line 11 of the LSI is detected by a section 23b, which has approximately the same configuration as the section 23a and also is surrounded by a broken line. However, because the voltage to be sampled is the voltage on the terminal nb, the connection of the switch n3q is different from the connection of the non-inverted input terminal of the voltage comparator n4q. In the section 23b, the differences from the section 23a are expressed by adding q to the end of the signs. In the section 23b, the elements having the same symbols with q removed exhibit the same functions as those in the section 23a.

Next, the procedure for detecting the connection states is described with reference to the configuration shown in FIG. 15. The opening and closing of the switches necessary for detecting the connection states are the same as the actions of the timing shown in FIG. 3. The opening and closing of the switches shown in FIG. 3, supply of the voltage Vdd from the voltage generator 19, and opening and closing of the switches n3 and n3q are timed by the clock signal from the clock generator 20. In FIG. 15, the connection of the clock signal line is omitted.

With respect to the connections to be inspected, the open and closed states of the switches are set as shown in FIG. 3, and thereafter the voltage supplied from the voltage generator 19 is set to 3.3 V. The voltage 3.3 V is sampled in the capacitor C by opening and closing the switch n3. After sampling, the switch n3 is in the open state. Next, the voltage supplied from the voltage generator 19 is set to 3.4 V, which is higher than 3.3 V. The voltage of the terminal na increases to 3.4 V. The sampled voltage 3.3 V and the voltage 3.4 V of the terminal na are compared by the voltage comparator n4. At this time, when the connections to be inspected are in the connected state, because the voltage of the terminal na has increased, the output signal is at a logic "H" level. When the connections to be inspected are in the unconnected state, no operating voltage is supplied to the voltage comparator n4. Thus, the output signal is at a logic "L" level. The above-described procedure also is carried out with respect to the grounding line of the LSI by the section 23b. Furthermore, the procedure is repeated for respective connections.

Third Embodiment

Figure 5:
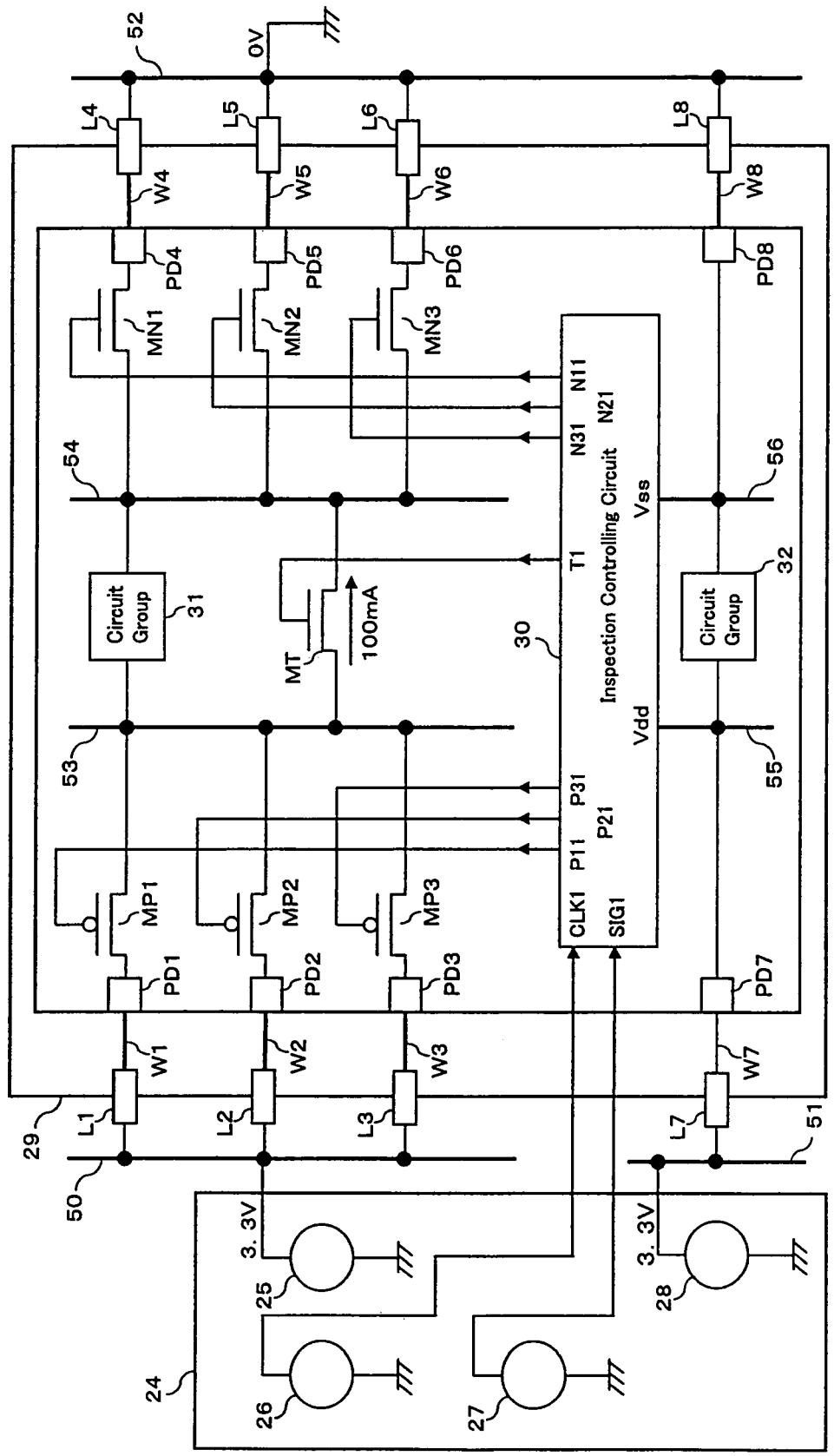
FIG. 5 is a block diagram showing a configuration of a test LSI and an inspection device thereof according to a third embodiment of the present invention.

FIG. 5 is a configuration of a test LSI and an inspection device thereof according to a third embodiment of the present invention.

In FIG. 5, numeral 24 denotes an inspection device. The inspection device 24 includes a voltage generator 25 including a voltage source and an ammeter for detecting a current outputted from the voltage source; a clock generator 26; a signal source 27; and a voltage source 28. Numeral 29 denotes a test LSI, numeral 30 denotes an inspection controlling circuit, and numerals 31 and 32 denote circuit groups. Here, the switches in FIG. 5 with the same signs as those in FIG. 2 have the same roles. Furthermore, the switches MP3 and MN3 have the same roles as the switches MPM3 and MNM3 in FIG. 2. The voltage generator 25, the clock generator 26 and the signal source 27 have the same roles as the voltage generator 19, the clock generator 20 and the signal source 21 in FIG. 2.

The power source line 53 and the power source line 55 of the LSI are independent, and are unconnected with each other inside the test LSI 29. Also, the grounding line 54 and the grounding line 56 of the LSI are independent wires, and are unconnected with each other inside the test LSI 29. The power source line 50 and the power source line 51 of the printed board are divided. However, they may be commonized, and the voltage source 28 may be removed.

To the Vdd terminal and the Vss terminal of the inspection controlling circuit 30, voltages of 3.3 V and 0 V are supplied from the voltage source 28 and GND, through the power source line 55 and the grounding line 56 of the LSI, respectively. The opening and closing of the switches MP1, MP2, MP3, MN1, MN2, MN3 and MT are controlled by signals P11, P21, P31, N11, N21, M31 and T1 outputted from the inspection controlling circuit 30.

A circuit group 31 is connected between the power source line 53 and the grounding line 54 of the LSI. For example, the circuit group 31 has the same type of circuit configuration as the circuit group 6 in FIG. 1 and the circuit group 15 in FIG. 2. The circuit group 32 is connected between the power source line 55 and the grounding line 56 of the test LSI 29. For example, the circuit group 32 is the same type of circuit as the circuit group 15 in FIG. 2.

In the configuration according to the second embodiment shown in FIG. 2, voltages 3.3 V and 0 V are supplied to the Vdd terminal and the Vss terminal of the inspection controlling circuit 22 by closing the switches MPS3 and MNS3 by the switches MPT and MNT. However, according to the configuration of this embodiment, the switches MPT and MNT, and the switches MPS3 and MNS3 in FIG. 2 are not needed. To the Vdd terminal and the Vss terminal of the inspection controlling circuit 30, voltages of 3.3 V and 0 V are supplied from the voltage source 28 and GND through the power source line 55 and the grounding line 56 of the LSI, respectively.

Figure 6:
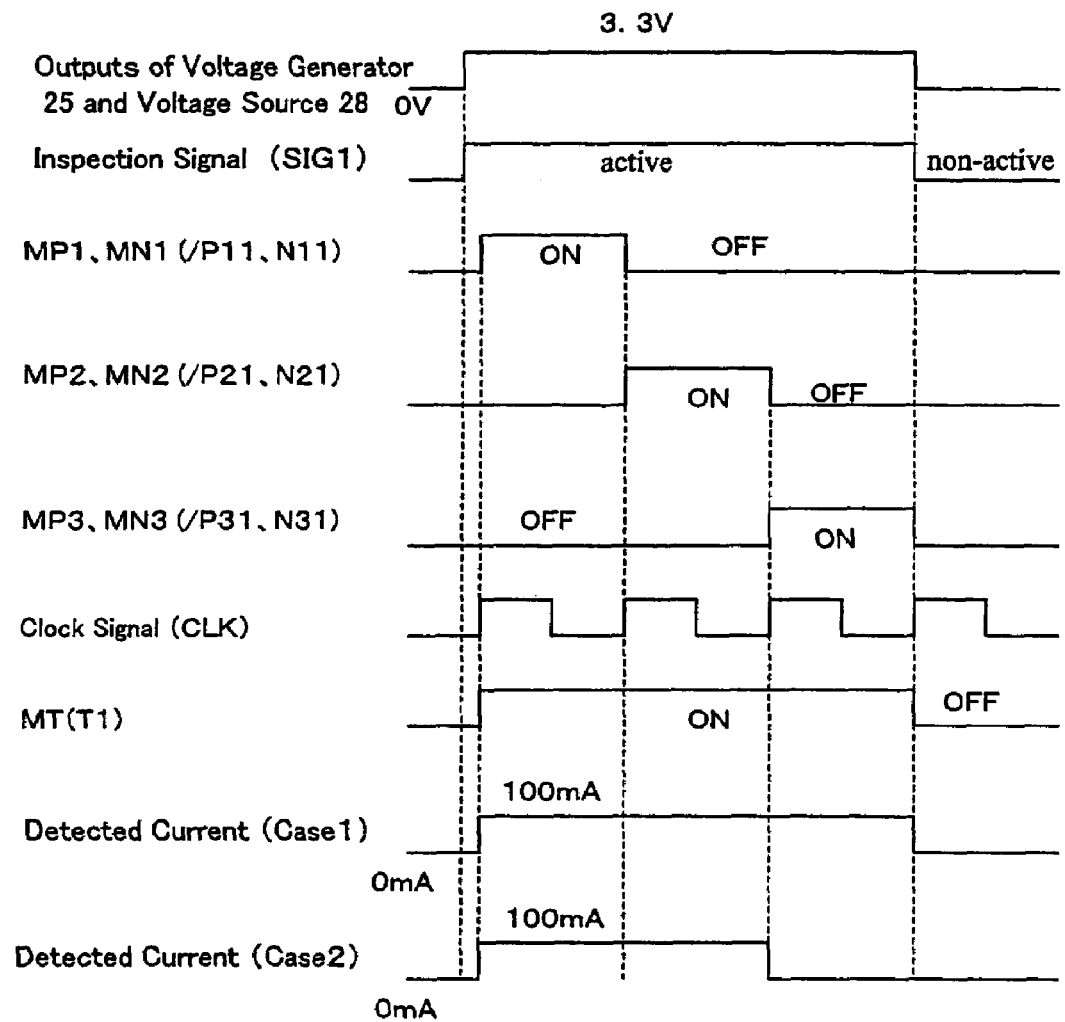
FIG. 6 is a timing chart showing the opening and closing of respective switches at the time of connection inspection according to the third embodiment of the present invention.

FIG. 6 is a timing chart showing the actions of respective switches when carrying out connection inspection.

When inspecting the connection states of the wires W1 and W4, the switches MP1, MN1 and MN are closed, and the switches MP2 and MP3 and the switches MN2 and MN3 are opened. When the wires W1 and W4 are connected, a current of 100 mA is detected by the ammeter in the voltage generator 25. The current is limited to 100 mA by the switch MT. When a current of 100 mA flows, the wires W1 and W4 are connected. When the current does not flow, the wires W1 and W4 are unconnected.

Next, when the connection states of the wires W2 and W5 are inspected, the switches MP2, MN2 and MT are closed, and the remaining switches MP1, MN1, MP3 and MN3 are opened. The operation timing of respective switches complies with the clock signal CLK of the clock generator 26. Because the connection inspection of the wires W3 and W6 is carried out in the same manner as that of the wires W1 and W4 or the wires W2 and W5, explanation thereof is omitted.

The connection states of the wires W7 and W8 are determined by whether or not the inspection controlling circuit 30 starts its operation. When the wires W7 and W8 are connected, the connections of respective terminals can be inspected by opening and closing respective switches. When one or both of the wires W7 and W8 are unconnected, connection inspection cannot be carried out. When one or both of the wires W7 and W8 are unconnected, no current is outputted from the voltage generator 28 at the time of connection inspection.

Thus, to know the connection states of the wires W7 and W8, it is necessary that the power source terminal of the power source line 55 and the grounding terminal of the grounding line 56 of the LSI are each single. When operating voltages of 3.3 V and 0 V are supplied respectively to the power source terminal Vdd and the grounding terminal Vss of the inspection controlling circuit 30, operation thereof is started by an inspection signal SIG1 outputted from the signal source 27.

Figure 7:
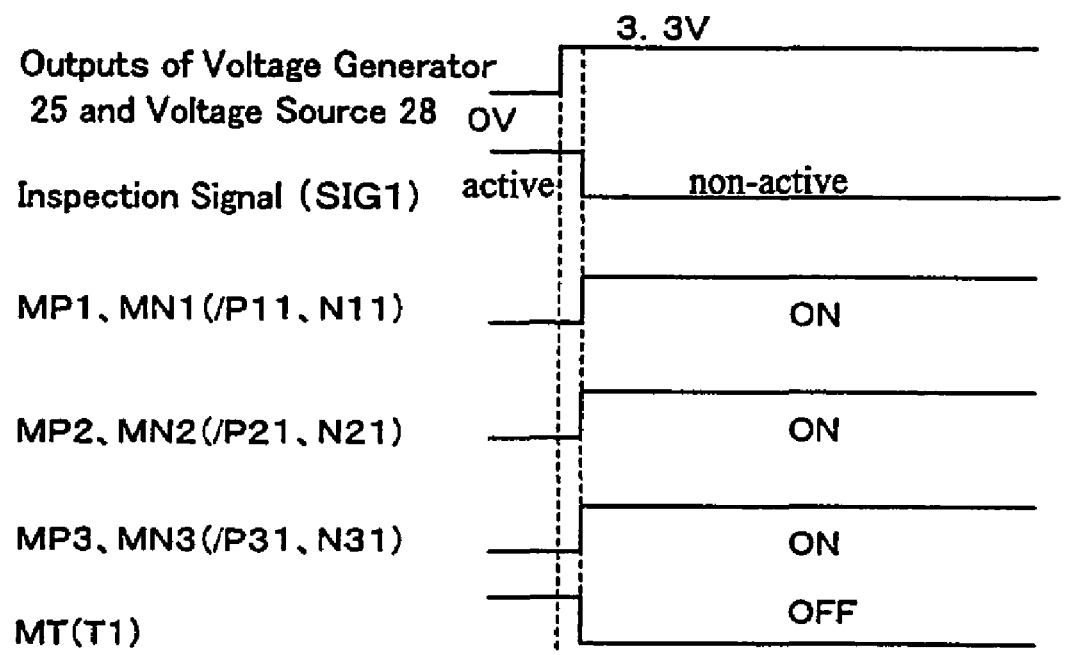
FIG. 7 is a timing chart showing the opening and closing of respective switches at the time of normal operation according to the third embodiment of the present invention.

In FIG. 6, cases 1 and 2 show changes of current indicated by the ammeter in the voltage generator 25. The case 1 is a change of current when all of the wires W1 to W8 are connected. The case 2 is a change of current when the wires W1, W2, W4, W5, W7 and W8 are connected, and one or both of the wires W3 and W6 are unconnected. FIG. 7 is a timing chart showing the open and closed states of respective switches at the time of normal operation. In FIGS. 6 and 7, the signals P11, P21 and P31 are shown by inverted signals. The actions at inspection operation and the actions at normal operation are determined by the inspection signal SIG1 outputted by the signal source 27.

Fourth Embodiment

Figure 8:
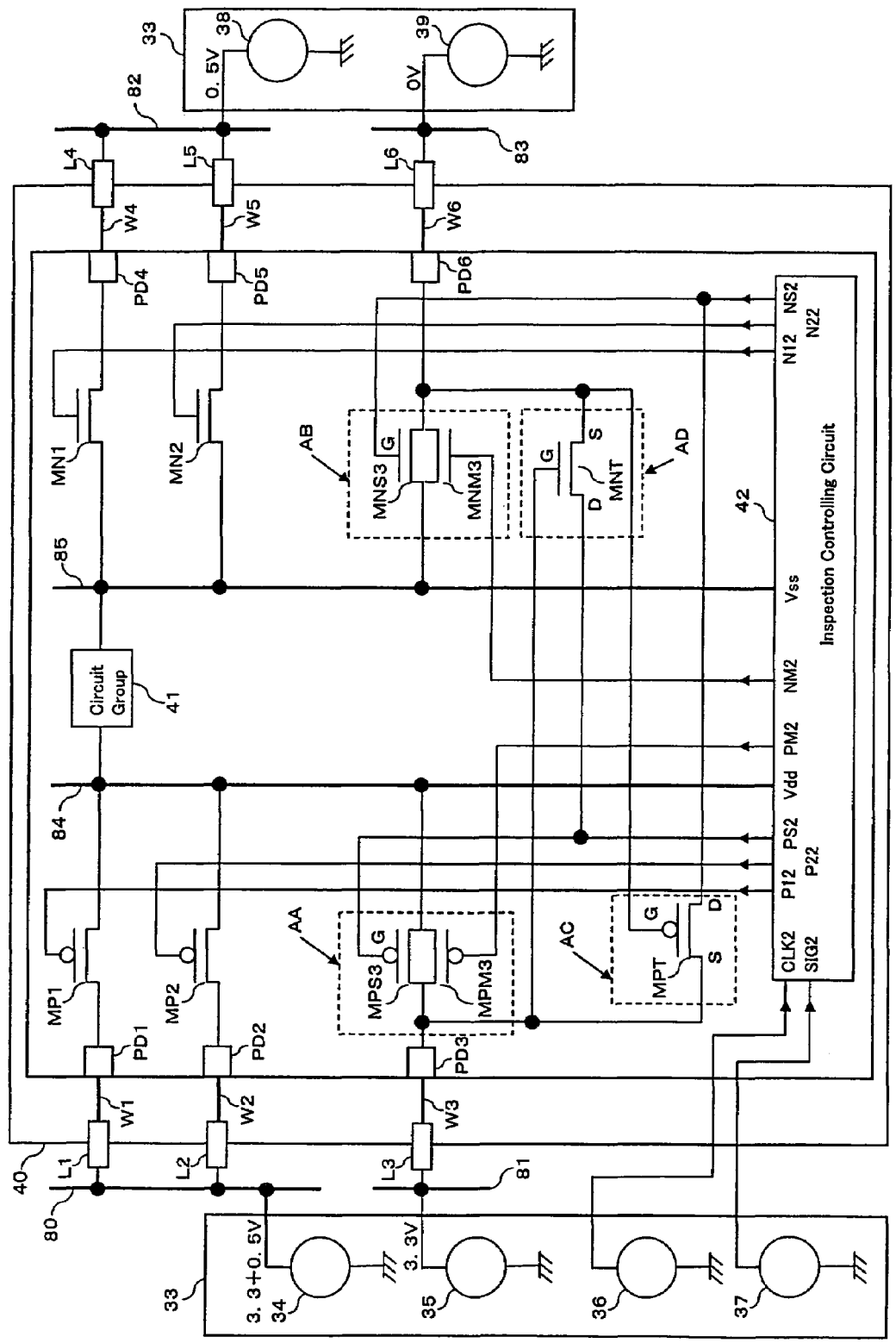
FIG. 8 is a block diagram showing a configuration of a test LSI and an inspection device thereof according to a fourth embodiment of the present invention.

FIG. 8 is a configuration of a test LSI and an inspection device thereof according to a fourth embodiment of the present invention. This embodiment is an application of the second embodiment. In this embodiment, the switch MT provided in the second embodiment is not needed. The power source line and the grounding line of the printed board are divided into the power source lines 80 and 81 and the grounding lines 82 and 83 of the printed board, respectively. In FIG. 8, the switches indicated by the same signs have the same roles as the switches shown in FIG. 2, but the opening and closing actions are different.

In FIG. 8, numeral 33 denotes an inspection device; numerals 34 and 38 denote voltage generators including a voltage source and an ammeter for measuring a current outputted from the voltage source; numerals 35 and 39 denote voltage sources; numeral 36 denotes a clock generator, and numeral 37 denotes a signal source. Numeral 41 denotes a circuit group, which is, for example, the same type of circuit group as the circuit group 6 shown in FIG. 1. Numeral 40 denotes a test LSI. Numeral 42 denotes an inspection controlling circuit.

Figure 9:
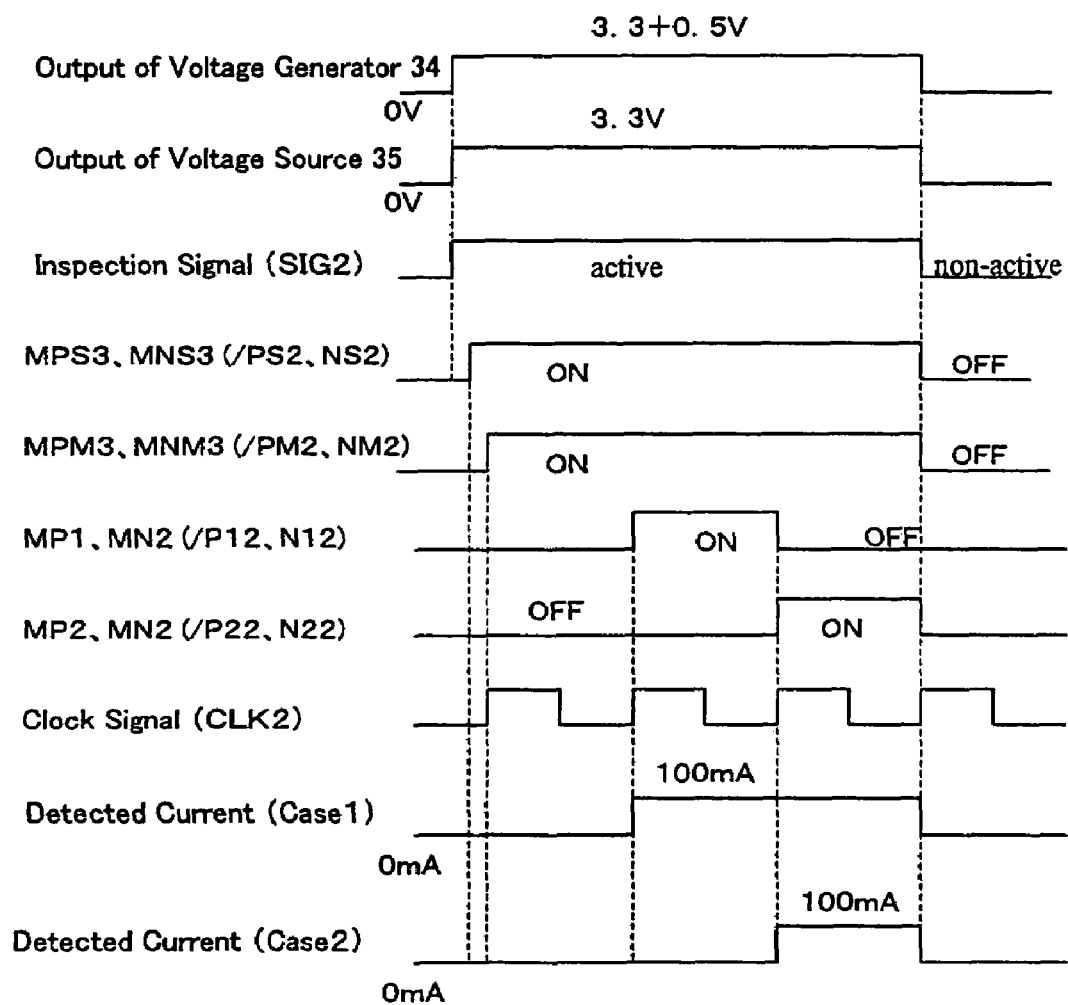
FIG. 9 is a timing chart showing the opening and closing of respective switches at the time of connection inspection according to the fourth embodiment of the present invention.

FIG. 9 is a timing chart showing the opening and closing actions of respective switches at the time of inspection. Opening and closing actions of the switches MP1, MP2, MPS3, MPM3, MN1, MN2, MNS3 and MNM3 are controlled by signals P12, P22, PS2, PM2, N12, N22, NS2 and NM2 from the inspection controlling circuit 42. The operation timing of respective switches is provided by a clock signal CLK2 of the clock generator 36.

When inspecting the connection states of the wires W1 and W3 and the wires W4 and W6, the switches MP1, MPS3, MPM3, MN1, MNS3 and MNM3 are closed, and the switches MP2 and MN2 are opened. The voltage generator 34 outputs a voltage of, for example, 3.3+0.5 V, and the voltage source 35 generates a voltage of 3.3 V. The voltage generator 38 generates a voltage of, for example, 0.5 V, and the voltage source 39 is at 0 V.

At this time, when the wires W1 and W3 are connected, because a current flows from the voltage generator 34 toward the voltage source 35, a current is detected by the ammeter included in the voltage generator 34. When both or one of the wires W1 and W3 are unconnected, no current flows, so that no current is detected by the ammeter in the voltage generator 34.

In FIG. 8, the switch MT having the role of limiting current as shown in FIG. 2 is not provided. The amount of current is adjusted by the voltage difference between the voltage generator 34 and the voltage source 35, and the voltage difference between the voltage generator 38 and the voltage source 39.

When the wires W4 and W6 are connected, a current flows from the voltage generator 38 to the voltage source 39, so that a current is detected by the ammeter included in the voltage generator 38. When both or one of the wires W4 and W6 are unconnected, no current is detected.

Because inspection of the connections of the wires W2 and W3 and the wires W5 and W6 is carried out in the same way as the inspection of the wires W1 and W3 and the wires W4 and W6, explanation thereof is omitted.

FIG. 9 shows a change of current detected by the ammeter in the voltage generator 34. The case 1 is a change of current when the wires W1 to W3 are connected. The case 2 is a change of current when the wire W1 is unconnected and the wires W2 and W3 are connected.

The combination of wires to make the switches closed at the time of inspection is not necessarily limited to the above combination. The connections of respective wires also can be inspected by inspecting the connections of the wires W1 and W2 and the wires W4 and W5, instead of inspecting the connections of the wires W1 and W3 and the wires W4 and W6.

In the second embodiment, the switch MT is provided between the power source line 10 and the grounding line 11, which are the power source line and the grounding line inside the test LSI 17. However, as in this embodiment, when each of the power source line and the grounding line of the printed board can be divided into two, it is not necessary to provide the switch MT.

Figure 10:
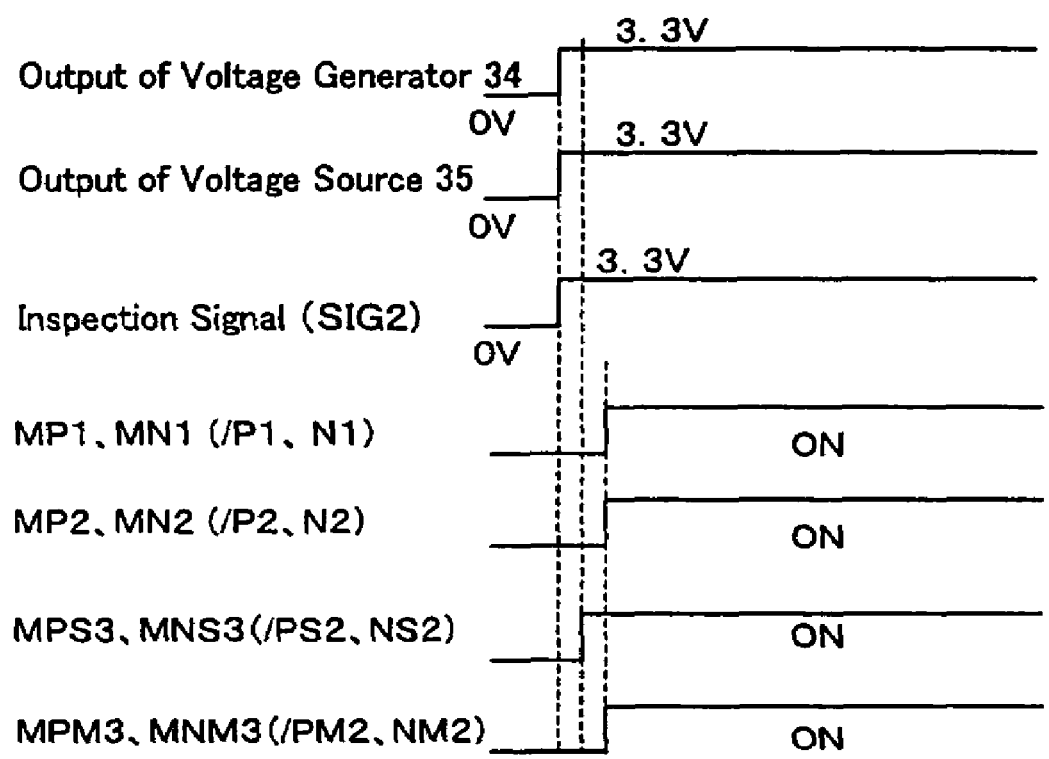
FIG. 10 is a timing chart showing the opening and closing of respective switches at the time of normal operation according to the fourth embodiment of the present invention.

FIG. 10 is a timing chart showing the open and closed states of respective switches at the time of normal operation. The grounding lines 82 and 83 are at 0 V. Whether the test LSI 40 is set to inspection operation or normal operation is determined by the output signal SIG2 of the signal source 37.

Fifth Embodiment

In FIG. 8, which shows the fourth embodiment, the switches MPS3/MPM3 and MNT contained in sections AA and AD surrounded by broken lines may be removed, and the pad PD3 may be connected directly to the power source line 84 of the LSI. Furthermore, the switches MNS3/MNM3 and MPT contained in sections AB and AC surrounded by broken lines may be removed, and the pad PD6 may be connected directly to the grounding line 85 of the LSI.

Figure 11:
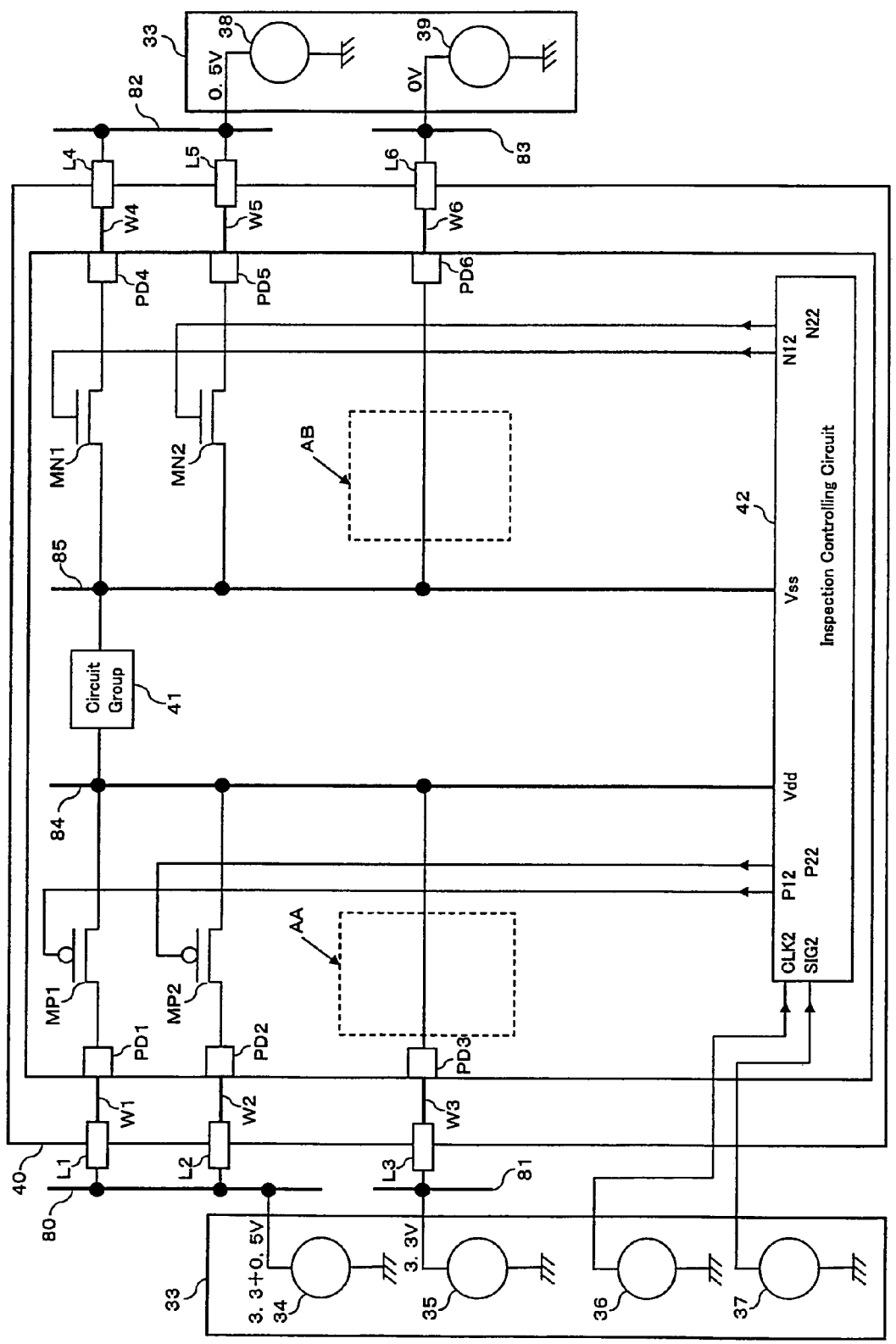
FIG. 11 is a block diagram showing a configuration of a test LSI and an inspection device thereof according to a fifth embodiment of the present invention.

FIG. 11 is a configuration of a test LSI and an inspection device according to a fifth embodiment of the present invention, which is a modification of the configuration of the fourth embodiment.

In FIG. 11, the switches in the sections AA, AB, AC and AD surrounded by broken lines in FIG. 8 are removed. The pad PD3 is connected directly to the power source line 84 of the LSI, and the pad PD6 is connected directly to the grounding line 85 of the LSI. Other elements of the configuration are the same as those in FIG. 8, and are denoted by the same signs.

In FIG. 11, the power source line 81 of the printed board is connected directly to the power source line 84 of the LSI without passing through a switch. Furthermore, the grounding line 83 of the printed board is connected directly to the grounding line 85 of the LSI without passing through a switch. According to this configuration, an IDDQ test of the LSI can be carried out easily. This is because the IDDQ test is carried out to detect deficiencies in manufacture of the circuit group 41, and it is desired that the power source terminal and the grounding terminal of the circuit group 41 are connected directly to external terminals.

Figure 12:
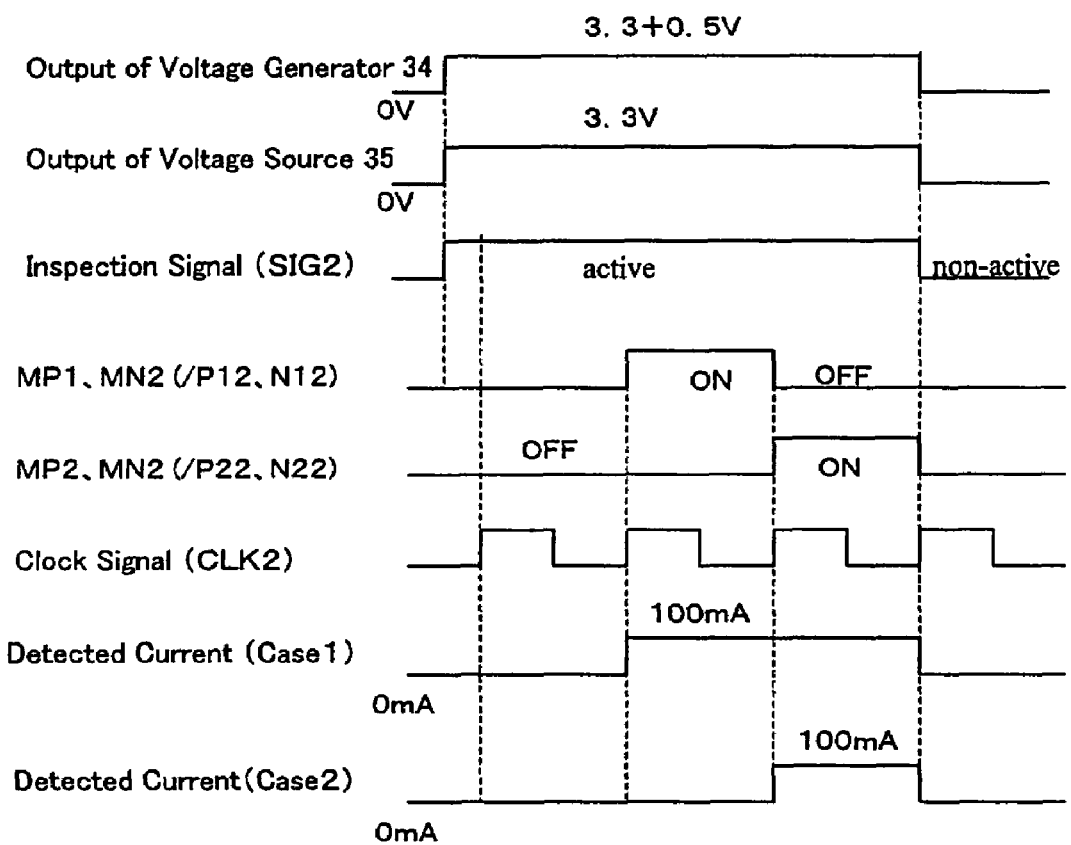
FIG. 12 is a timing chart showing the opening and closing of respective switches at the time of connection inspection according to the fifth embodiment of the present invention.

Next, referring to FIG. 12, a method for connection inspection is described.

FIG. 12 is a timing chart showing the opening and closing actions of switches at the time of inspection.

When the connection states of the wires W1 and W4 are inspected, the switches MP1 and MN1 are closed, and the switches MP2 and MN2 are opened. And a current flowing from the voltage generator 34 to the voltage source 35 and a current flowing from the voltage generator 38 to the voltage source 39 are detected. When inspecting the connection states of the wires W2 and W5, the switches MP2 and MN2 are closed, the switches MP1 and MN1 are opened, and a current is detected. The connection states of the wires W3 and W6 are determined by whether or not the inspection controlling circuit 42 operates. Alternatively, an ammeter is provided in the voltage source 35 or 39 to detect a current of the inspection controlling circuit 42.

Figure 13:
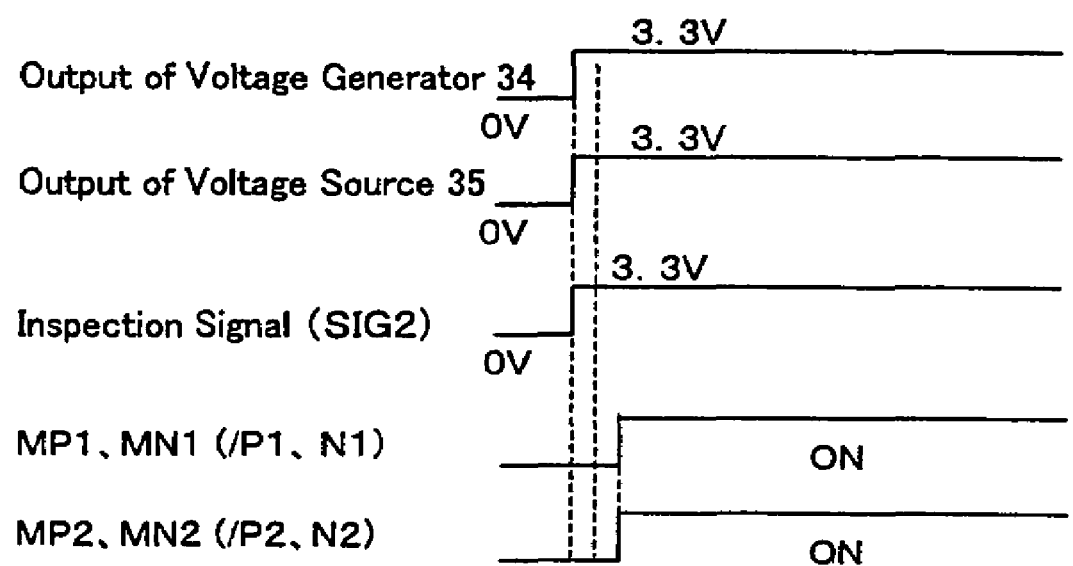
FIG. 13 is a timing chart showing the opening and closing of respective switches at the time of normal operation according to the fifth embodiment of the present invention.

As examples of the detection result by the ammeter, the case 1 in FIG. 12 shows that the wires W1 to W3 are connected, and the case 2 shows that the wires W2 and W3 are connected and the wire W1 is unconnected. FIG. 13 is a timing chart showing the open and closed states of respective switches at the time of normal operation. The grounding lines 82 and 83 are at 0 V.

In the above embodiments of the present invention, it has been described that the inspection controlling circuit 5 in FIG. 1, the inspection controlling circuit 22 in FIG. 2, the inspection controlling circuit 30 in FIG. 5, and the inspection controlling circuit 42 in FIGS. 8 and 11 are provided inside the semiconductor chips of the test LSIs 4, 17, 29 and 40, respectively. However, they also may be provided outside the semiconductor chips.

Although the case of inspecting the connection states of power source terminals and grounding terminals of a semiconductor chip sealed in a plastic package has been described, the connection inspection method of the present invention is not limited to the inspection of a semiconductor chip sealed in a plastic package.

For example, when a semiconductor chip is connected to another element, the inspection method of the present invention can be employed to inspect the connection of both elements. For example, when a carrier and a semiconductor chip are connected with a microbump as in C-CSP (ceramic chip sized package) or the like, the present invention can be employed to inspect the connection between the semiconductor chip and the carrier. Or when the semiconductor chip is connected directly to another semiconductor chip, the present invention can be employed to inspect the connection between these semiconductor chips. Or when the semiconductor chip is connected directly to a printed board, the present invention can be employed to inspect the connection between the semiconductor chip and the printed board.

Particularly, in a C-CSP, a plurality of power source lines and grounding lines of the chip may be integrated into single or fewer number of power source line and grounding line inside a carrier after they are connected to the carrier. This corresponds to the condition in which the leads L1 to L3 and the leas L4 to L6 are commonized respectively in FIG. 1. In this case, the method for inspecting the connection states of the power source terminals and grounding terminals according to the present invention also can be used.

With respect to the connection inspection of a C-CSP, the switches MP1, MP2, MPS3, MPM3, MN1, MN2, MNS3, MNM3, MP3 and MN3, which limit the power source line and the grounding line to be inspected, are provided inside the test LSI. Thus, the time for inspection can be shortened, and the inductance of the power source line and grounding line can be decreased.

Furthermore, as described with reference to FIG. 1, the device detects whether or not a current outputted from the voltage source 1 flows, and whether or not the path for flowing the current is interrupted on its way. When a plurality of paths of the current such as power source terminals and grounding terminals are present, the path of the current is selected by switches. By combining the selected paths of the current, the connection states of respective terminals are detected. Mentioned above is the connection inspection method of the present invention. Therefore, the procedure for opening and closing the switches, which shows the procedure for inspecting the connection states of terminals, is not limited to those in FIGS. 3, 6, 9 and 12. The connection inspection also can be carried out by other procedure for opening and closing the switches.

Finally, it is understood that the invention may be embodied in other specific forms without departing from the spirit or essential characteristics thereof. The embodiments disclosed in this application are to be considered in all respects as illustrative and not restrictive, so that the scope of the invention being indicated by the appended claims rather than by the foregoing description, and all changes which come within the meaning and range of equivalency of the claims are intended to be embraced therein.

What is claimed is:

1. A semiconductor device having a semiconductor integrated circuit, the semiconductor device comprising:
   a first plurality of leads, each of the leads for supplying the semiconductor device with a first power source from an outside;
   a second lead for supplying the semiconductor device with a second power source having a voltage different from a voltage of the first power source from an outside;
   a first internal power source line directly connected to an internal circuit including a plurality of logic circuits of the semiconductor integrated circuit, the first internal power source line for supplying the internal circuit of the semiconductor integrated circuit with the first power source;
   a second internal power source line directly connected to the internal circuit of the semiconductor integrated circuit, the second internal power source line for supplying the internal circuit with the second power source;
   a first plurality of internal terminals, each of the internal terminals coupled to a corresponding one of the first plurality of leads and supplying the first internal power source line with the first power source from a corresponding one of the first plurality of leads;
   a second internal terminal coupled to the second lead and supplying the second internal power source line with the second power source from the second lead;
   a switching circuit portion including a plurality of switching circuits, each of the plurality of switching circuits interposed between a corresponding one of the first plurality of internal terminals and the first internal power source line; and a voltage change detecting portion connected to the first and the second internal power source lines, the voltage change detecting portion sampling a first voltage of the first power source input through one of the plurality of switching circuits and comparing the first voltage sampled therein with a second voltage of the first power source input through another one of the plurality of switching circuits.

2. A semiconductor integrated circuit comprising:

an internal circuit including a plurality of logic circuits;

a first internal power source line directly connected to the internal circuit, the first internal power source line for supplying the internal circuit with a first power source;

a second internal power source line directly connected to the internal circuit, the second internal power source line for supplying the internal circuit with a second power source having a voltage different from a voltage of the first power source;

a first plurality of internal terminals, each of the internal terminals supplying the first internal power source line with the first power source;

a second internal terminal supplying the second internal power source line with the second power source;

a switching circuit portion including a plurality of switching circuits, each of the plurality of switching circuits interposed between a corresponding one of the first plurality of internal terminals and the first internal power source line; and a voltage change detecting portion connected to the first and the second internal power source lines, the voltage change detecting portion sampling a first voltage of the first power source input through one of the plurality of switching circuits and comparing the first voltage sampled therein with a second voltage of the first power source input through another one of the plurality of switching circuits.

* * * * *